United States Patent
Kubo et al.

(10) Patent No.: US 7,922,291 B2
(45) Date of Patent: Apr. 12, 2011

(54) INK JET HEAD AND HEAD UNIT

(75) Inventors: Tomoyuki Kubo, Nagoya (JP); Seiji Shimizu, Ogaki (JP); Hiroo Ogawa, Nagoya (JP); Hiromitsu Mizutani, Ichinomiya (JP); Atsushi Ito, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 1103 days.

(21) Appl. No.: 11/700,343

(22) Filed: Jan. 31, 2007

(65) Prior Publication Data

US 2007/0182787 A1 Aug. 9, 2007

(30) Foreign Application Priority Data

Jan. 31, 2006 (JP) .................................. 2006-021933
Apr. 10, 2006 (JP) .................................. 2006-107233

(51) Int. Cl.
*B41J 2/14* (2006.01)
*B41J 2/05* (2006.01)
*B41J 2/045* (2006.01)

(52) U.S. Cl. .............................. 347/50; 347/58; 347/71

(58) Field of Classification Search .................... 347/50, 347/58, 68–72
See application file for complete search history.

(56) References Cited

U.S. PATENT DOCUMENTS

| 6,270,205 B1 | 8/2001 | Takata |
| 6,595,628 B2 | 7/2003 | Takagi et al. |
| 6,672,715 B2 | 1/2004 | Isono et al. |
| 6,742,883 B1 | 6/2004 | Takata |
| 6,955,427 B2 | 10/2005 | Takata |
| 7,040,737 B2 | 5/2006 | Takata et al. |
| 2002/0030715 A1 | 3/2002 | Takata et al. |
| 2004/0060969 A1* | 4/2004 | Imai et al. ................ 228/180.21 |
| 2005/0179747 A1 | 8/2005 | Iamai et al. |
| 2005/0195249 A1 | 9/2005 | Nakamura et al. |

FOREIGN PATENT DOCUMENTS

| JP | 6314866 | 11/1994 |
| JP | 2002-26205 | 1/2002 |
| JP | 2002231761 | 8/2002 |
| JP | 2002-254634 | 9/2002 |
| JP | 2003-80709 | 3/2003 |
| JP | 2004096005 | 3/2004 |
| JP | 2005-161760 | 6/2005 |
| JP | 2005-246779 | 9/2005 |

* cited by examiner

*Primary Examiner* — Geoffrey Mruk
(74) *Attorney, Agent, or Firm* — Frommer Lawrence & Haug LLP

(57) ABSTRACT

An ink jet head, includes: an actuator including a plurality of terminals; a wiring material including a base made of a flexible resin film on which a plurality of lands are arranged in arrays corresponding to the plurality of terminals, the wiring material of which one end is superimposed on a surface of the actuator, and which is extended in a direction parallel to the surface of the actuator; and a drive circuit for driving the actuator, wherein: the wiring material includes a small width portion, of which a width in a direction, perpendicular to an extended direction is smaller than that of the one end superimposed on the actuator, arranged on an extended portion; and the drive circuit is mounted on the extended portion; and wiring patterns are formed on the wiring material, for connecting the drive circuit and the plurality of lands.

17 Claims, 16 Drawing Sheets

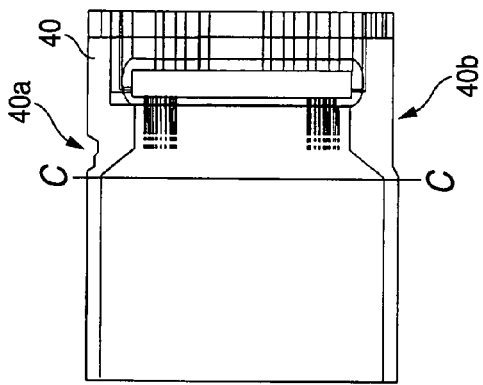
FIG. 8C
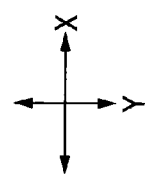
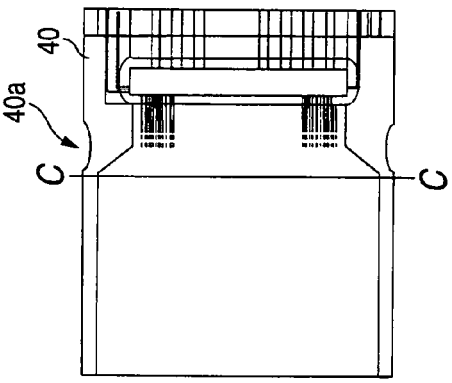
FIG. 8A
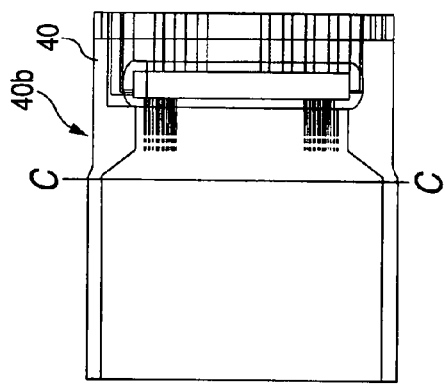
FIG. 8B

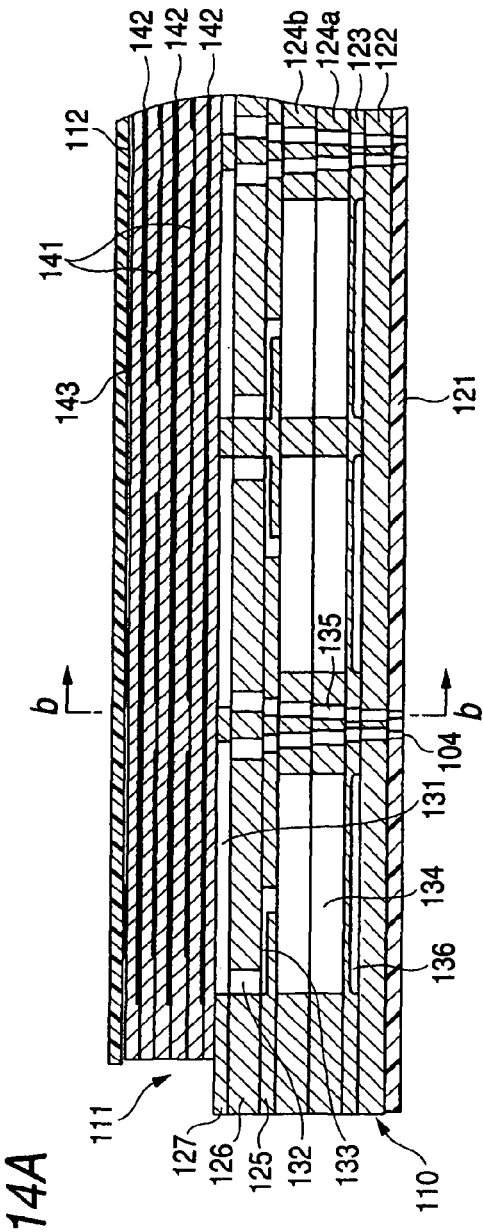
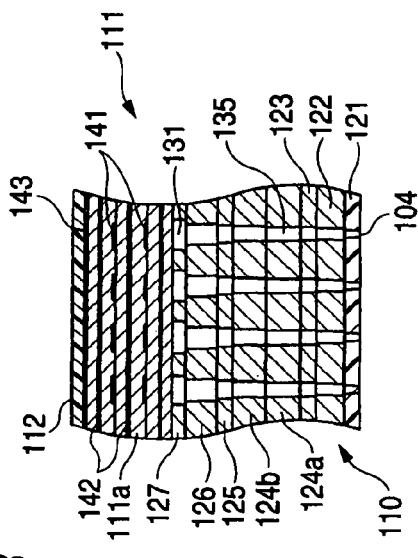
FIG. 14A
FIG. 14B

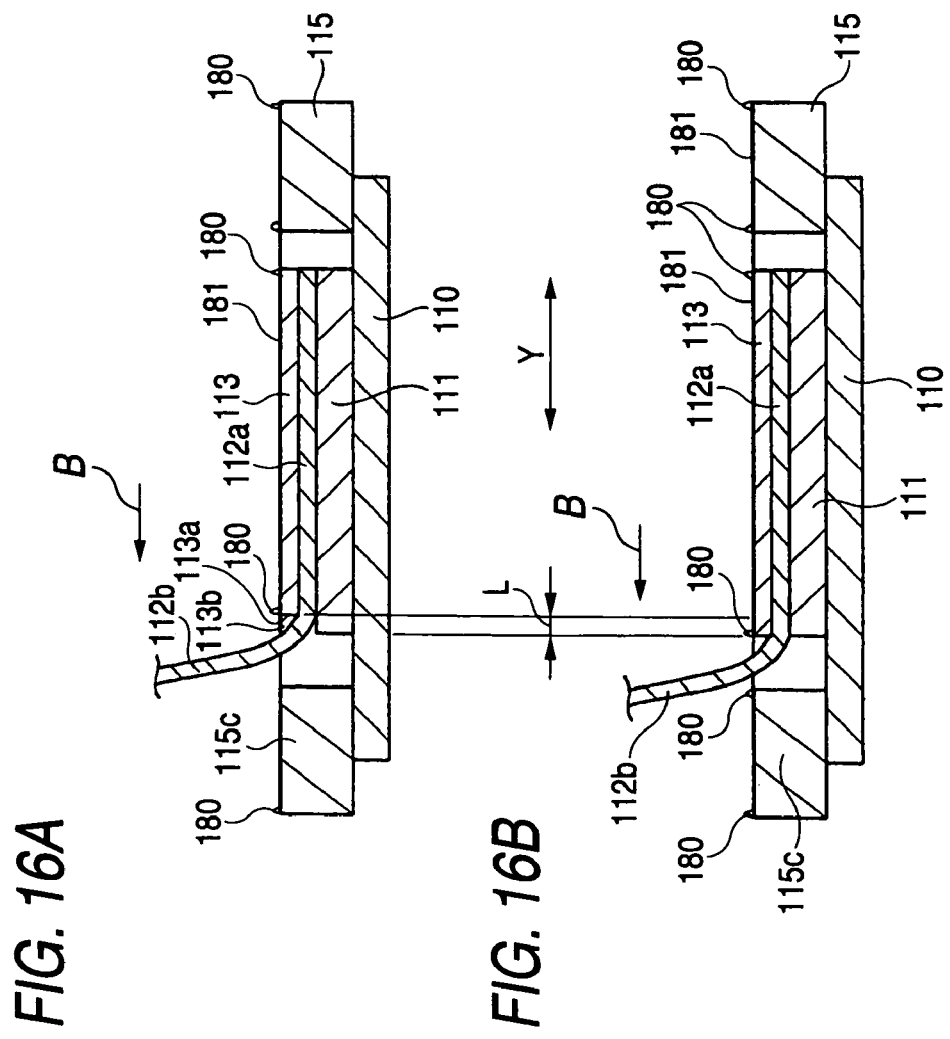

INK JET HEAD AND HEAD UNIT

CROSS-REFERENCE TO THE RELATED APPLICATION(S)

This application is based upon and claims priority from prior Japanese Patent Applications No. 2006-021933 filed on Jan. 31, 2006, and No. 2006-107233 filed on Apr. 10, 2006, the entire contents of which are incorporated herein by reference.

TECHNICAL FIELD

The present invention relates to a configuration of a wiring material, for supplying electricity to an actuator, of an ink jet head and a head unit, and an ink jet head which selectively ejects ink inside a cavity portion by means of an actuator.

BACKGROUND

In an ink jet head, a flexible wiring material for supplying the electricity to an actuator is superimposed on and bonded to the actuator, extended from over the actuator, and a drive circuit in an IC chip form for driving the actuator is mounted on the extended portion, as disclosed in JP-A-2005-161760. In the ink jet head, as wiring patterns formed on the flexible wiring material are wired finely and in a high concentration in order to provide a high resolution, as a result of which an electrical resistance in the wiring patterns becomes high, it being necessary to make a wiring pattern linking the circuit drive and the actuator as short as possible, the drive circuit is disposed in a position near the actuator on the flexible wiring material. The flexible wiring material generally has a plurality of wiring patterns distributed on a base material made of a resin, ends of the wiring patterns form connection portions, and on the actuator and a substrate on an opposite side having terminals corresponding to the connection portions, the terminals and the connection portions of the wiring patterns are bonded by a conductive connecting material such as a solder or a conductive adhesive.

Herein, as the flexible wiring material and the actuator and substrate on the opposite side are bonded by melting the solder by thermocompression or the like, a portion of the flexible wiring material superimposed on the actuator expands due to a heat, but a portion extended from the actuator does not expand as it is not heated, meaning that a distortion occurs in a whole of the flexible wiring material due to a difference in expansion between the two portions. Although the flexible wiring material is disposed passing through a narrow gap in an apparatus while being bent appropriately, at that time, in the event that the heretofore described kind of distortion occurs, it becomes difficult to bend it as desired and pass it through the narrow gap. Also, in the event, as heretofore described, that the drive circuit mounted on the flexible wiring material is positioned near the actuator, when bending the distorted flexible wiring material, there is a possibility of a large force being exerted on a connection portion of the wiring pattern and the drive circuit, or of the distortion reaching the connection portion and disconnecting the connection portion.

To date, as a way of combating a problem in which, in the event that the flexible wiring material and the opposing substrate have a differing heat expansion rate, an imperfect connection with the flexible wiring material is likely to occur due to a discrepancy of the expansion, configurations described in JP-A-06-314866 and JP-A-2004-96005 have been considered.

For example, in JP-A-06-314866, a flexible substrate sandwiches the wiring patterns (a conductor pattern in JP-A-2005-161760) between two sheets of polyimide film and is bonded, and a window is formed in a leading edge of the wiring pattern. When a connection terminal of the wiring patterns and the wiring pattern of a glass substrate are connected by means of a soldering, it being possible for a heat stress on the glass substrate caused by the soldering to escape from the window, it is possible to reduce an effect thereof, increasing a reliability of a connection.

Also, in JP-A-2004-96005, a base material of a flexible substrate including a central portion supporting base material in a central portion of the wiring patterns (a conductive wiring in JP-A-06-314866), and a leading end base material in each leading end of the wiring patterns, a connection portion of the wiring patterns is exposed between the two base materials, in the central portion supporting base material, at least one slit is formed between the wiring patterns in a form penetrating from an end positioned on one connection portion side to an end positioned on the other connection portion side. For this reason, when bonding the central portion supporting base material and the leading end base material by thermocompression, even in the event that there is a difference in a heat expansion rate of the base materials, it is possible to reduce a shearing force occurring in the bonding portion.

SUMMARY

In a case in which a large number of wiring patterns and lands are disposed complexly on the flexible wiring material, as with the ink jet head, their configurations are difficult to decipher, and also, it has not been possible to eliminate a wiring complication caused by the distortion in the whole of the flexible wiring material, as described heretofore, or a disconnection of a connection portion of the drive circuit mounted on the flexible wiring material and the wiring patterns.

Aspects of the present invention provide an ink jet head and a head unit that can reduce the distortion of the wiring material caused by the thermocompression of the wiring material and the actuator, facilitate a disposition of the wiring material, and increase a reliability of not only the connection portion of the actuator and the wiring patterns, but also the connection portion of the drive circuit and the wiring patterns.

Further, other aspects of the present invention provide an ink jet head which can prevent the separation of the electrical bond of the flexible flat cable and the actuator, and prevent the damage to the flexible flat cable caused by the burr occurring in the member, while suppressing the manufacturing cost.

According an aspect of the invention, there is provided an ink jet head including: an actuator including a plurality of terminals arranged in arrays on a surface of the actuator, for applying pressure corresponding to a plurality of energy generators for ejecting ink; a wiring material coupled with a base made of a flexible resin film on which a plurality of lands are arranged in arrays corresponding to the plurality of terminals the wiring material of which one end is superimposed on the surface of the actuator, and which extended to a direction parallel to the surface of the actuator; and a drive circuit for driving the actuator, wherein: the terminals and the lands are bonded by thermocompression; the wiring material includes a small width portion, of which a width in a direction perpendicular to an extended direction of the wiring material is smaller than that of the one end superimposed on the actuator, arranged on an extended side of the wiring material; the drive circuit is mounted on the extended side of the wiring material;

and wiring patterns are formed on the wiring material, for connecting the drive circuit and the plurality of lands.

According another aspect of the invention, there is provided a head unit including: an ink jet head including: an actuator including a plurality of terminals arranged in arrays on a surface of the actuator, for applying pressure corresponding to a plurality of energy generators for ejecting ink; a wiring material coupled with a base made of a flexible resin film on which a plurality of lands are arranged in arrays corresponding to the plurality of terminals, the wiring material of which one end is superimposed on the surface of the actuator, and which extended to a direction parallel to the surface of the actuator; and a drive circuit for driving the actuator; and a box-shaped head holder including: a bottom wall; and a slit, wherein: the terminals and the lands are bonded by thermocompression; the wiring material includes a small width portion, of which a width in a direction perpendicular to an extended direction of the wiring material is smaller than that of the one end superimposed on the actuator, arranged on an extended side of the wiring material, the drive circuit is mounted on the extended side of the wiring material; wiring patterns are formed on the wiring material, for connecting the drive circuit and the plurality of lands; the ink jet head is installed under the bottom wall of the box-shaped head holder; and the wiring material is passed through the slit opened in the bottom wall.

According another aspect of the invention, there is provided an ink jet head including: a cavity portion which opens a plurality of nozzles onto an exterior and has an ink channel in an interior; an actuator which selectively applies an ejection pressure to ink inside the cavity portion; a flexible flat cable which transmits a drive signal being bonded to the actuator, wherein: the actuator includes a plurality of electrodes arranged in a flat formation corresponding to the plurality of nozzles; the flexible flat cable includes a flat portion superimposed on the plurality of electrodes of the actuator and electrically bonded, and a flexible portion extended with one end of the flat portion as a base; the flexible portion includes removed portions removing both side edges parallel to a extended direction of the flexible portion; the removed portions are formed so that a width dimension of a direction perpendicular to the extended direction is smaller than that of the flat portion; a rigid plate is affixed to a rear surface of a side opposite to a side on which the flexible flat material is bonded to the plurality of electrodes, and covers an approximate whole surface of the flat portion; a rigidity of the rigid plate is higher than that of the flexible flat cable; an end edge of the rigid plate, which is the extended side of the flexible portion, is cut into a side opposite to the extended direction of the flexible portion as a notch; a width of the notch is approximately equivalent to that of a narrow portion of the flexible portion; and the rigid plate includes two protrusions protruding toward the removed portions of the flexile portion, in both ends of a direction perpendicular, to the extended direction of the flexible portion.

BRIEF DESCRIPTION OF THE DRAWINGS

FIG. 6A is a plan view of a bottom surface of a flexible wiring material, while
FIG. 6B is a sectional view;
FIG. 7A is a sectional view illustrating a heat expansion of the flexible wiring material caused by a thermocompression of the actuator and the flexible wiring material, while
FIGS. 8A, 8B and 8C show other aspects of a notch;
FIG. 14A is a sectional view seen from the arrowed line VI-VI of FIG. 12, while
FIG. 14B is a sectional view seen from the arrowed line b-b of FIG. 14A;
FIG. 16A is a sectional view of a case using a rigid plate having a notch, while
FIG. 16B is a sectional view of a case using a rigid plate with no notch.

DETAILED DESCRIPTION

Hereafter, a description will be given of an aspect of the invention, with reference to the drawings. In the following description, a side ejecting ink will be taken as a bottom side and a bottom direction, while an opposite side thereto will be taken as a top side and a top direction.

Figure 1:
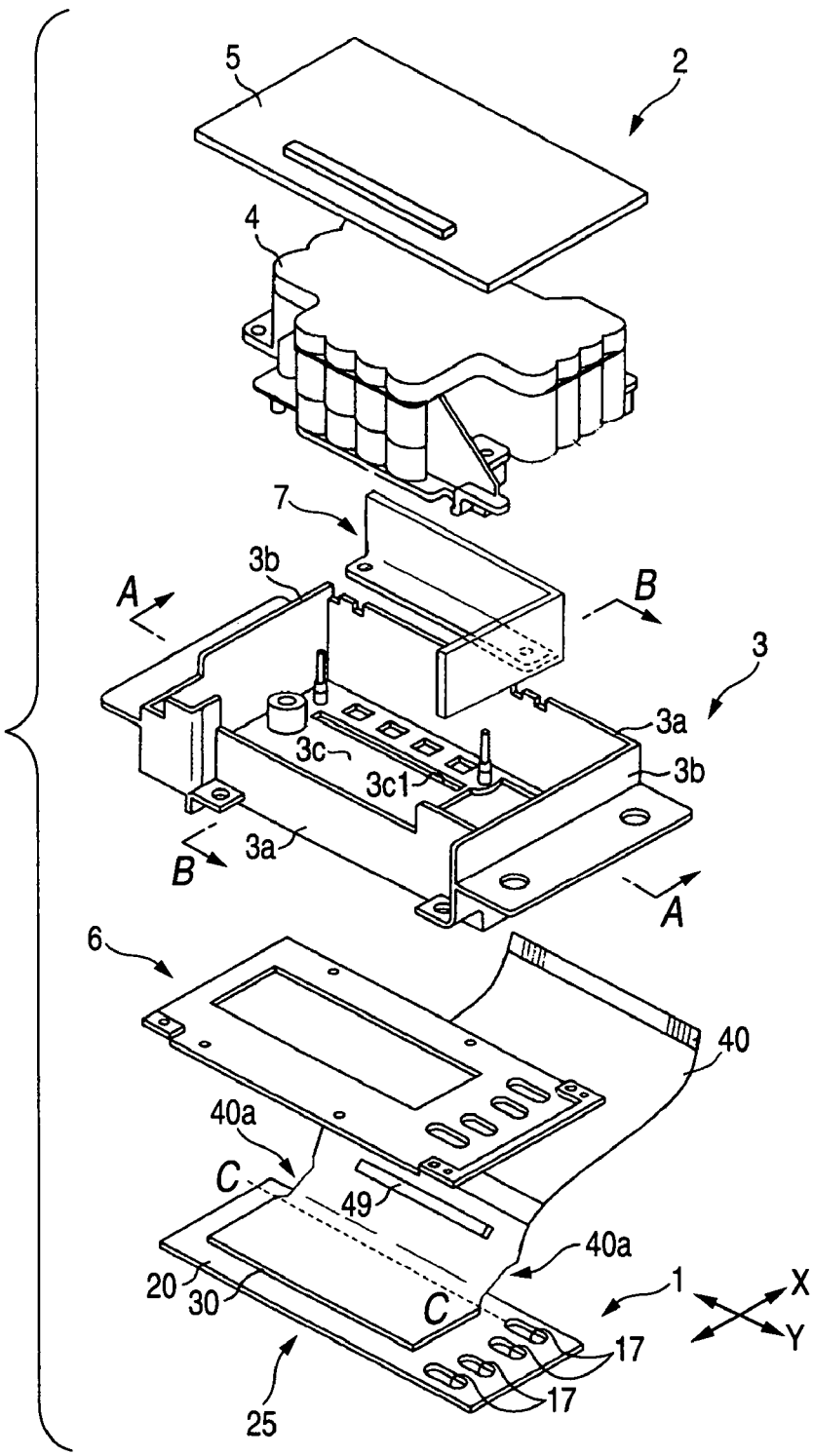
FIG. 1 is an exploded perspective view of a head unit.

In an ink jet printer apparatus, a head unit 2 is provided on a guide shaft (not shown) in such a way as to be able to move along recording paper. The head unit 2 is configured of an approximately, box-shaped head holder 3 functioning as a carriage, in which are mounted an ink jet head 1 (hereafter called a head) which causes ink to be ejected from nozzles 25 formed in a bottom surface thereof, an ink tank 4 in which are stored ink of various colors, for example, black B, cyan C, magenta M and yellow Y, and a circuit substrate 5 connected to an external power source (not shown). Then, by an actuator 30 of the head 1 being driven while the head unit 2 executes a reciprocating scan in a width direction (an X direction in FIG. 1) along the recording paper, the ink is ejected from the nozzles 25 and a printing is carried out.

Figure 2:
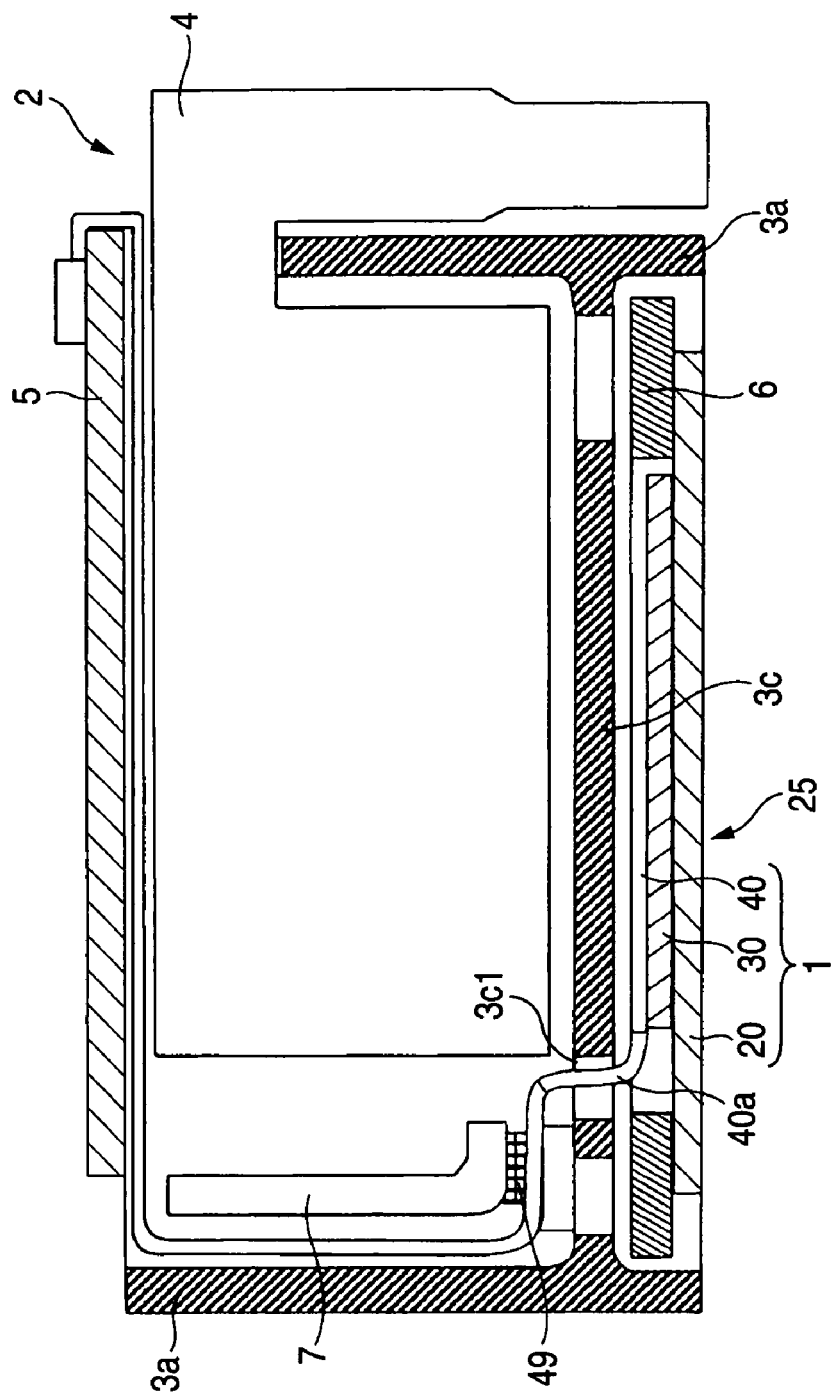
FIG. 2 is an A-A sectional view of the head unit.
Figure 3:
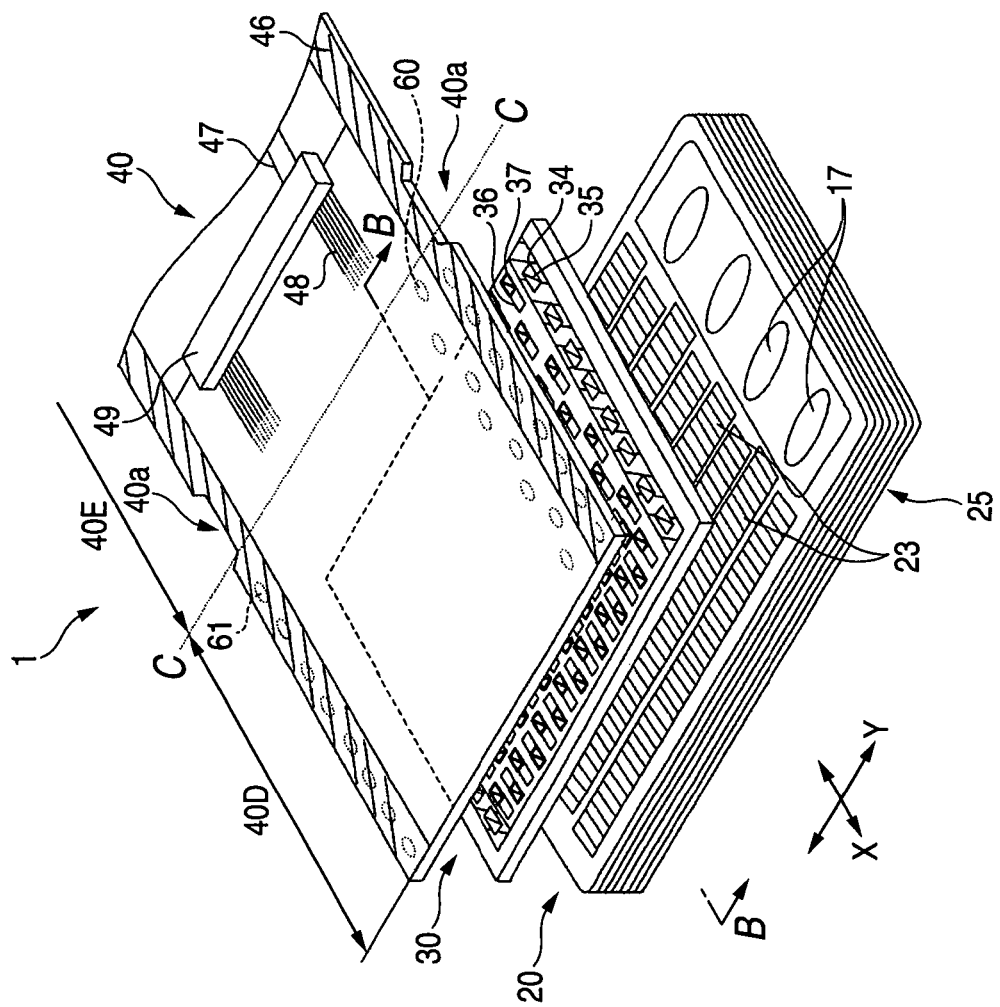
FIG. 3 is an exploded perspective view of a head.
Figure 4:
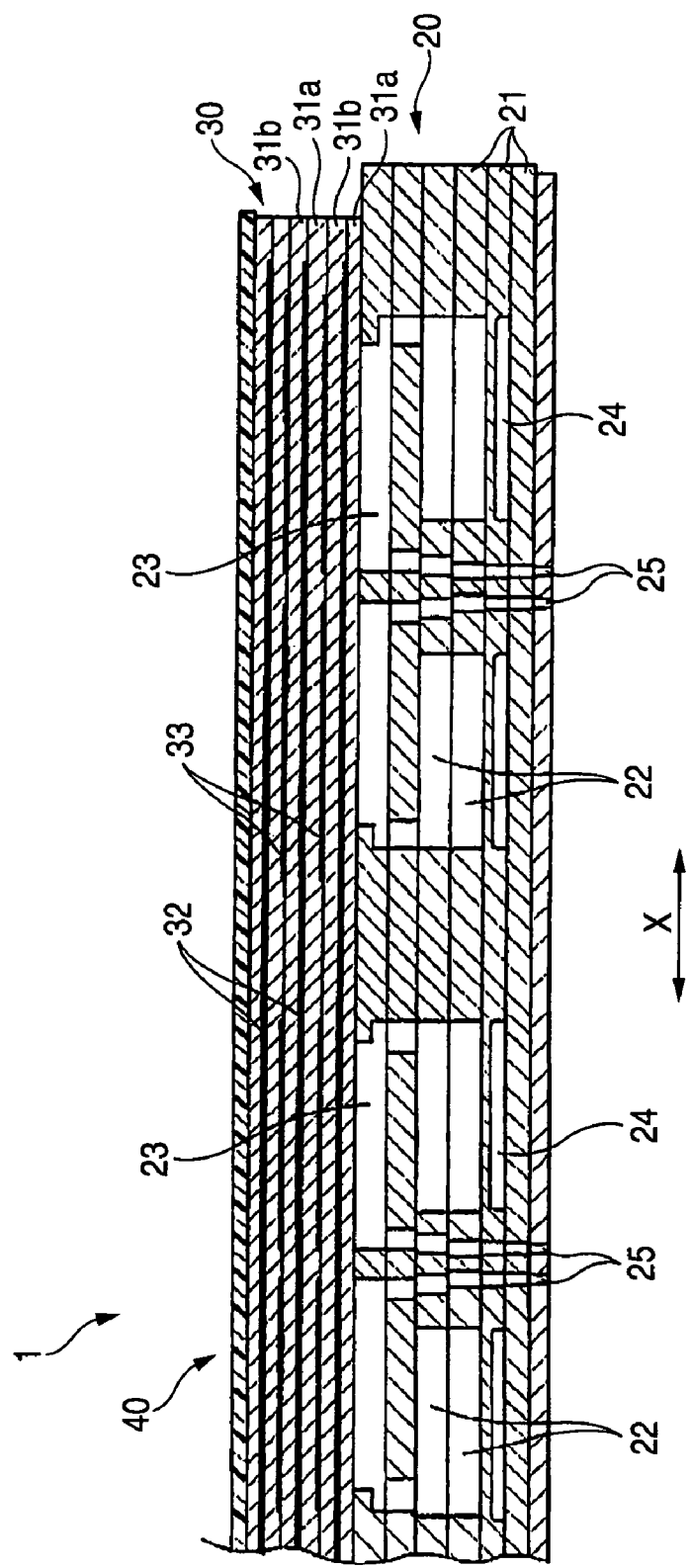
FIG. 4 is a B-B sectional view of the head.

The head 1 being the same as a heretofore known one described in JP-A-2003-80709, as shown in FIGS. 3 and 4, is configured in such a way that the plate type actuator 30, which selectively applies an ejection pressure to the ink inside a cavity unit 20, is bonded by means of an adhesive sheet to a top of the cavity unit 20, which has on a bottom surface a nozzle surface on which a plurality of the nozzles 25 are arranged in a Y direction, furthermore, a flexible wiring material 40 is electrically connected to a top surface of the actuator 30 by one end being bonded to the actuator 30, while the other end is extended parallel to a surface of the cavity unit and in the X direction, and furthermore, a drive circuit 49, to be described hereafter, is mounted. Then, the head 1 being adhesively supported by a reinforcement frame 6 as in FIGS. 1 and 2, the extended end of the flexible wiring material 40 is fed from a bottom surface through a slit 3c1 penetrating a bottom wall 3c of the head holder 3, and the head 1, along with the reinforcement frame 6, is affixed by an adhesive to the bottom surface of the bottom wall 3c of the head holder 3. Also, a heat sink 7, which is in contact with the drive circuit 49 and causes heat from the drive circuit 49 to be radiated, and the ink tank 4 being mounted in the head holder 3, the circuit substrate 5 is installed above them. The flexible wiring material 40 fed through the slit 3c1 extends in an upward direction parallel to a side surface 3a of the head holder 3, and is connected to a connector provided on the circuit substrate 5.

The cavity unit 20 being configured of a plurality of thin plates 21 of a kind in FIGS. 3 and 4 being stacked and bonded by the adhesive, the plurality of nozzles 25 are arranged staggered in the lowermost plate 21 in a longitudinal direction (a Y direction) of the cavity unit 20, and in a direction (the X direction) perpendicular thereto, two arrays for each ink color, a total of eight arrays, are provided at an appropriate interval. Also, a plurality of pressure chambers 23 being formed in an elongated form in plan view in a topmost surface of the plate 21, they are formed in such a way that one end in a longitudinal direction (the X direction) communicates with the plurality of nozzles 25, while the other end communicates with manifold channels 22. The plurality of pressure chambers 23, corresponding to the nozzle arrays, are formed staggered in the longitudinal direction (the Y direction) of the cavity unit 20, and form a total of eight pressure chamber arrays, arranged in two arrays for each ink color in the direction (the X direction) perpendicular thereto.

Also, an ink supply port 17 being provided for each ink color in a top surface of the cavity unit 20, a configuration is such that each ink supplied from the ink tank 4 is supplied to the ink supply port 17, the ink which flows into the manifold channels 22 in the cavity unit 20 extending from the individual ink supply ports 17 is distributed by ink color into the plurality of pressure chambers 23 via through holes in the cavity unit 20, and from the pressure chambers 23, reaches the corresponding nozzles 25. In the aspect, the thin plates 21 of the cavity unit 20 have a thickness in the order of 50 to 150 μm, the plate 21 having the plurality of nozzles 25 is made of a synthetic resin such as polyimide, and the other plates are made of a 42% nickel alloy steel sheet. The nozzles 25 have a microscopic diameter in the order of 20 μm.

Next, a description will be given of the actuator 30. The actuator 30, as shown in FIG. 4, is configured of a plurality of ceramic layers 31, including a bottommost ceramic layer covering each plurality of pressure chambers 23, stacked from the pressure chambers 23 side of the cavity unit 20 in a direction perpendicular to an arrangement surface of the plurality of pressure chambers 23. One ceramic layer has a thickness in the order of 30 μm, and is a piezoelectric ceramic such as PZT. Narrow discrete electrodes 33 being formed, in places corresponding to the individual pressure chambers 23 in the cavity unit 20, on a top surface (a broad surface) of, among the ceramic layers 31, even number ceramic layers 31b counting from a bottom, a length in the X direction thereof corresponds to a length of the pressure chambers 23. Also, common electrodes 32 common to the plurality of pressure chambers 23 are formed for the plurality of pressure chambers 23 on a top surface (a broad surface) of odd number ceramic layers 31a counting from the bottom, and are connected to an earth potential. The discrete electrodes 33 and the common electrodes 32, with the exception of the bottommost ceramic layer, are distributed alternately sandwiching at least one ceramic layer 31, and are mutually opposing. Then, each of the discrete electrodes 33 in the actuator 30 and each of the pressure chambers 23 in the cavity unit 20 are caused to oppose each other, and the cavity unit 20 and the actuator 30 are adhesively fixed to each other.

Also, the actuator 30, with a portion of the ceramic layers 31 between the discrete electrodes 33 and the common electrodes 32, which oppose each other in a stacking direction of the plurality of ceramic layers 31, as an energy generator, by the drive circuit 49, to be described hereafter, selectively applying a voltage between the discrete electrodes 33 and the common electrodes 32, the energy generators corresponding to the discrete electrode 33 to which the voltage has been applied is distorted in the stacking direction, the displacement changes a capacity of the pressure chambers 23, a pressure and a pressure wave which eject the ink are generated, and the ink is ejected from the nozzles 25.

That is, the energy generators, being identical in quantity to the pressure chambers 23, are arranged in the array direction (the Y direction) corresponding to identical arrays. Also, the energy generators, being formed lengthwise in the X direction in a longitudinal direction of the pressure chambers 23, and adjacent energy generators also being of the same distribution as the pressure chambers 23, are arranged staggered, with two arrays being arranged in the X direction for each ink color.

Figure 5:
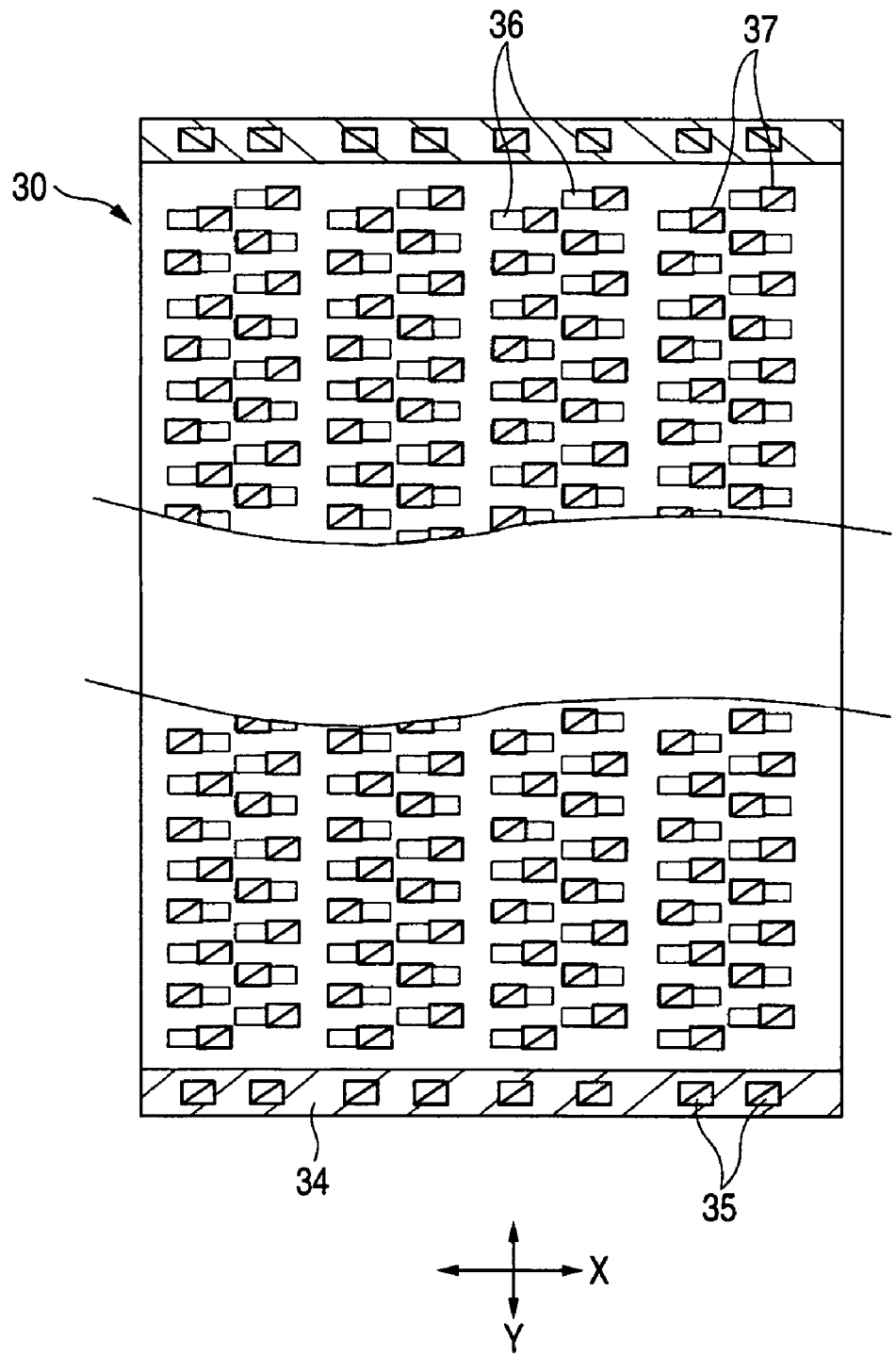
FIG. 5 is a plan view of a topmost surface of an actuator.

Furthermore, as in FIGS. 3 and 5, discrete surface electrodes 36 and common surface electrodes 34, corresponding to the discrete electrodes 33 and the common electrodes 32, are formed on the top surface of the topmost layer of the actuator 30. The individual surface electrodes 36 and 34, in the same way as a heretofore known configuration described in JP-A-2003-80709, are electrically connected to the respective discrete electrodes 33 and common electrodes 32 via a conductive material filling a through hole (not shown) penetrating the stacking direction of the stacked ceramic layers 31. Although the discrete surface electrodes 36 are approximately parallel to the discrete electrodes 33, and have approximately the same narrow rectangular shape, they are shorter than the X direction length of the discrete electrodes 33. Also, as with the arrays of the nozzles 25 (the pressure chambers 23), two arrays of the discrete surface electrodes 36 being provided in the X direction for each ink color in the longitudinal direction (the Y direction) of the actuator 30, two arrays forming a pair are each arranged so as to be staggered. The arrays of the discrete surface electrodes 36 also correspond to the arrays of the discrete electrodes 33. Also, the common surface electrodes 34 are formed in a strip shape along a perimeter of both outermost ends in the longitudinal direction (the Y direction) on the topmost surface of the actuator 30.

Discrete electrode terminals 37 and common electrode terminals 35 being provided respectively on the discrete surface electrodes 36 and the common surface electrodes 34, the terminals 37 and 35 are formed corresponding to discrete electrode lands 60 and common electrode lands 61, to be described hereafter, which are formed on a bonding surface (a bottom surface) of the flexible wiring material 40 bonded to the actuator 30. The discrete electrode terminals 37, being of approximately the same width as the discrete surface electrodes 36, and of a narrow rectangular shape configured short in a length direction, are arranged alternately, in each array of the discrete surface electrodes 36 (each array in the Y direction in FIG. 3), toward one end or toward the other end in a longitudinal direction (the X direction) of each of the discrete surface electrodes 36. That is, they are arranged in a staggered formation. Therefore, as shown in FIG. 3, the discrete electrode terminals 37 disposed extending in the Y direction in the staggered formation are formed arranged in eight arrays in the X direction. Also, the common electrode terminals 35, being of the same narrow rectangular shape as the discrete electrode terminals 37, and being provided in an array quantity identical to that of the discrete electrode terminals 37 in the X direction on the strip shaped common surface electrodes 34, are arranged in eight arrays in the aspect. Also, the discrete surface electrodes 36 and the common surface electrodes 34 of the actuator 30 are formed by screen printing a conductive member of a silver-palladium series, while the discrete electrode terminals 37 and the common electrode terminals 35 are formed by printing silver on the discrete surface electrodes 36 and the common surface electrodes 34.

Next, a description will be given of the flexible wiring material 40 as an example of a wiring material for electrically bonding to the plurality of discrete electrode terminals 37 and the common electrode terminals 35. As shown in FIG. 3, the flexible wiring material 40, on which are disposed a plurality of wiring patterns 47 and 48 for transmitting a control signal from an exterior, has one end electrically connected by being superimposed on the top surface of the topmost layer of the actuator 30, while the other end is extended within a plane parallel to the top surface and in a direction (the X direction) perpendicular to the arrays of terminals 37, and the drive circuit 49 is mounted on the extended portion of the flexible wiring material 40. The drive circuit 49, based on print data, selectively applies a voltage between the discrete electrodes 33 and the common electrodes 32, and in response to the application of the voltage, as described heretofore, the pressure and the pressure wave which eject the ink are generated, and the ink is ejected from the nozzles 25.

Figures 6A, 6B:
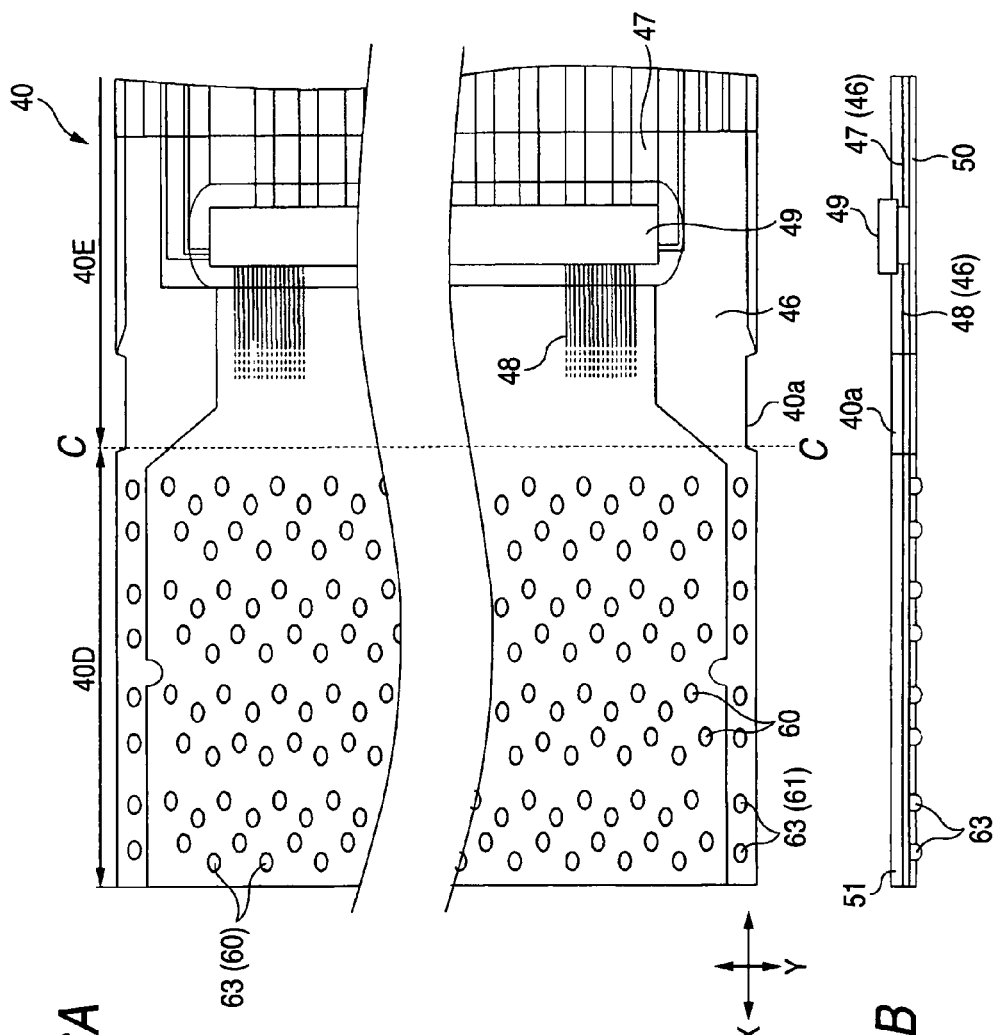

As shown in FIG. 6B, in the flexible wiring material 40, the plurality of discrete electrode lands 60 made of copper foil, to be described hereafter, and the plurality of common electrode lands 61, as well as a plurality of wiring patterns 46, 47 and 48 are formed of photoresist or the like on one surface of a strip shaped base material 50, which is made of a flexible synthetic resin film (for example, a polyimide resin) having an electrical resistance property, surfaces thereof are covered by a coverlay 51 consisting of a flexible synthetic resin film (for example, polyimide resin) having an electrical resistance property. The wiring patterns 47 are connected to a drive circuit 49 input side of the base material 50, and the wiring patterns 48 and common electrode leads 46 are connected to an output side. The discrete electrode lands 60 and the common electrode lands 61, being formed in positions corresponding respectively to the discrete electrode terminals 37 and the common electrode terminals 35, are connected to an end of the wiring patterns 48 and the common electrode leads 46. Furthermore, in the base material 50, holes 53 (openings) are opened in regions corresponding to the discrete electrode lands 60 and the common electrode lands 61, exposing the lands 60 and 61, and bump electrodes 63 are secured on the lands 60 and 61.

The plurality of island like discrete electrode lands 60 and the common electrode lands 61 being formed corresponding to the discrete electrode terminals 37 and the common electrode terminals 35 of the actuator 30, the discrete electrode lands 60, as well as being arranged staggered extending in the Y direction, maintain an interval in the X direction between the arrays, and are arranged in eight arrays. Also, each of the plurality of discrete electrode lands 60 being connected to the wiring patterns 48 connected to the drive circuit 49, each wiring pattern 48 extends in the extended direction (the X direction) of the wiring material 40 through the interval between the pluralities of discrete electrode lands 60, maintaining an appropriate interval, converges in such a way as to narrow a whole of a width of the wiring material 40 in a width direction, and is connected to the drive circuit 49.

Also, the common electrode lands 61 extend from the drive circuit 49 in the X direction, and are provided, in an array quantity identical to that of the discrete electrode lands 60, in the X direction on the common electrode leads 46 formed along a perimeter of both outermost ends of the flexible wiring material 40 in the Y direction. Eight are arranged in the aspect. The common electrode leads 46 are formed in a strip shape in such a way as to correspond to the common surface electrodes 34 of the actuator 30, superimposed approximately parallel thereon.

The bump electrodes 63 provided on the discrete electrode lands 60 and the common electrode lands 61 are attached by melting a conductive wax material such as a solder. Then, as shown in FIGS. 7A and 7B, by aligning the bump electrodes 63 on the discrete electrode lands 60 and the common electrode, lands 61 of the flexible wiring material 40 with the discrete electrode terminals 37 and the common electrode terminals 35 of the actuator 30 respectively, superimposing them, and heating and pressing with a bar heater from above the flexible wiring material 40, each bump electrode 63 is fused, and the discrete electrode terminals 37 and the common electrode terminals 35 can be electrically and mechanically connected to the corresponding lands 60 and 61.

Figure 7A:
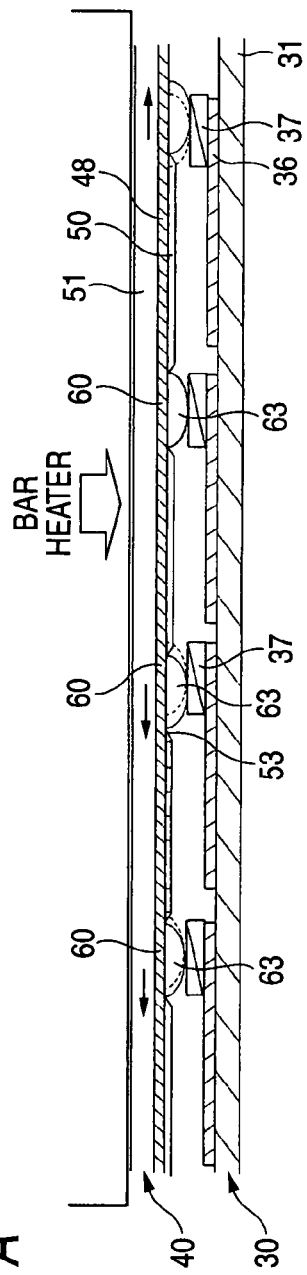
Figure 7B:
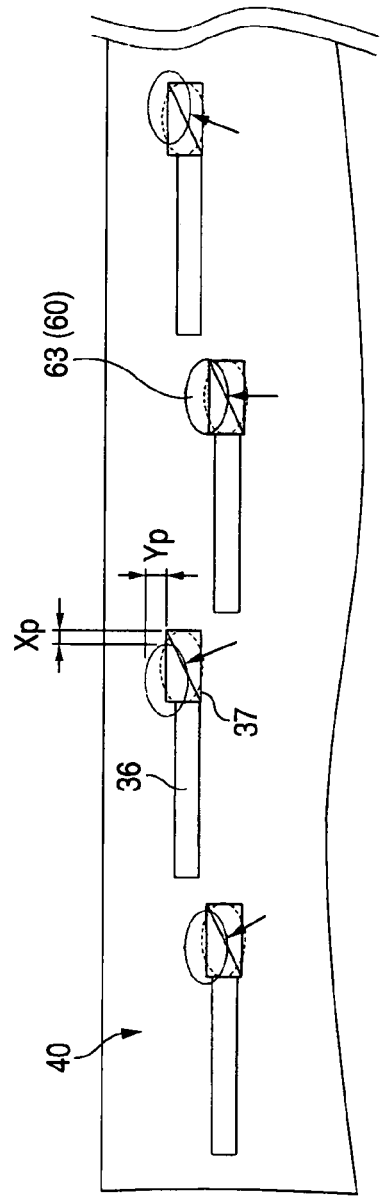
FIG. 7B is a fragmentary enlarged plan view showing a superimposition relationship between each discrete electrode terminal corresponding to each discrete surface electrode, and reach discrete electrode land corresponding thereto, in the plan view of the flexible wiring material in FIG. 7A.

At this time, as shown in FIGS. 7A and 7B, in the one end of the flexible wiring material 40 superimposed on the actuator 30, due to heat from the bar heater applied to the bonding surface with the actuator 30, the synthetic resin base material 50 thermally expands in a direction spreading from a center to an outside of the bonding surface. For this reason, each land 61 (bump electrode 63) formed on the flexible wiring material 40 undergoes a displacement, in a direction spreading from a center to an outside (to a position shown by a solid line) from a position (a broken line position) corresponding to each corresponding terminal 35 and 37 of the actuator 30, which may result in an imperfect contact. Consequently, in order that each land 61 of the flexible wiring material 40 is in a position in which contact is possible with each terminal 35 and 37 of the actuator 30 when the heat expansion occurs, expansion allowances (Xp, Yp) are taken into account in advance, a position in an arrangement direction (the Y direction) of each land 61 and in a direction (the X direction) perpendicular thereto are corrected by Xp and Yp and set, and they are formed on the flexible wiring material 40.

Also, in the flexible wiring material 40, as in FIGS. 3, 6A and 6B, notches 40a of an identical form are provided in a vicinity of a border C—C between an end 40D superimposed on the actuator 30 and a portion 40E extended therefrom, and in opposing positions in both side edges of the flexible wiring material 40 in the width direction (the Y direction). The position in which the notches 40a are provided is a position where the pluralities of wiring patterns 46 and 48 converge, outside the land 60 intervals in the direction in which the flexible wiring material 40 is extended (any one of a position in which the converging begins, a position in which the converging finishes or a midpoint of the two is acceptable). In positions in which the wiring patterns 48 pass between the lands 60, in order to ensure their widths and intervals, an overall prescribed width is necessary, but in the heretofore described positions, as there is no land 60, it is possible to easily provide the notches 40a while ensuring the widths and intervals of the wiring patterns 46 and 48.

In the flexible wiring material 40, as the heat from the bar heater is not applied to an area of the extended side (the X direction) which is not bonded to the actuator 30, a heat expansion difference is created between the two portions 40D and 40E of the flexible wiring material 40, in the vicinity of the border C—C between the two portions 40D and 40E, and a distortion or deformation may occur on a same flexible wiring material 40. In response to this, as the notches 40a are provided in both side edges of the flexible wiring material 40, in the vicinity of the border C—C (in other words, a narrow portion of the flexible wiring material 40 is provided between the two notches 40a), it is possible to prevent a stretching of the superimposed portion 40D due to the heat expansion from reaching the extended portion 40E. That is, it is possible to reduce an overall distortion of the flexible wiring material 40. In the aspect, the notches 40a being of a trapezoid in which a side in an innermost position in the width direction (the Y direction) of the flexible wiring material 40 is connected at obtuse angles to the adjacent sides, and angled portions forming the obtuse angles have a slightly radiused form.

Consequently, a distortion in the arrays of discrete electrode lands 60 in the vicinity of the border C—C is also suppressed, and an imperfect bonding between the discrete electrode lands 60 and the discrete electrode terminals 37 due to an expansion or contraction of the base material 50 in that portion is prevented. Also, as the wiring patterns 48 are made as short as possible, even in a case in which the drive circuit 49 is disposed in the vicinity of the border C—C, the distortion of the flexible wiring material 40 is prevented from reaching the bonding portion between the wiring patterns 48 and the drive circuit 49, and it is possible to increase a reliability of an electrical connection to each portion in a whole of the flexible wiring material 40. Also, as the notches 40a are provided in the flexible wiring material 40, when conveying and assembling the ink jet head in a manufacturing process, a free end of the wiring material 40 wobbles more flexibly than the notches 40a in response to an external force exerted on the wiring material 40, meaning that it is possible to mitigate a large force exerted directly on the bonding portion between the wiring material 40 and the actuator, and it is possible to reduce a danger of causing a disconnection, and to increase the reliability of the connection.

Furthermore, in the aspect, when passing the flexible wiring material 40 through the slit 3c1 in the bottom wall 3c of the head holder 3 at a time of assembly of the head unit 2, in the event that there is a large distortion in the flexible wiring material 40, it is necessary to pass it through while correcting the distortion, and there is a danger of a large force being exerted on the bonding portion between the wiring material 40 and the actuator 30, causing the disconnection. However, because the distortion of the flexible wiring material 40 is reduced, as described heretofore, there is little danger of the disconnection, and a disposition operation such as passing the flexible wiring material 40 through the slit 3c1 becomes easy.

Also, in the aspect, the notches 40a are provided on both side edges from the vicinity of the border to a position passing through the slit 3c1 in the bottom wall 3c of the head holder 3. As described heretofore, in a condition in which the flexible wiring material 40 passes through the slit 3c1, in the event that, due to an assembly position displacement between the side edge of the flexible wiring material 40 and a longitudinal direction end of the slit 3c1, the two come into contact, a pressing force comes to bear in the width direction of the flexible wiring material 40, a large force is exerted on the bonding portion between the wiring material 40 and the actuator, and there is a danger of the disconnection. However, as it is possible, by means of the notches 40a, to ensure a gap between the side edge of the flexible wiring material 40 and the longitudinal direction end of the slit 3c1, it is possible to reduce the danger of the disconnection. Furthermore, it is possible to miniaturize the head holder 3 by an amount by which a length of the slit 3c1 can be shortened.

Next, FIGS. 8A, 8B and 8C shows other aspects of the notch 40a. In FIG. 8A, it has a form of a half of an approximate ellipsoid. With regard to the form of the notch 40a, as far as an advantage of preventing the distortion due to the heat expansion difference is concerned, as long as it is positioned in the vicinity of the border C—C of the flexible wiring material 40, any form will provide the advantage, but from a point of view of avoiding the kind of effect due to the external force described heretofore, it is preferable that the vicinities of the innermost position in the width direction of the flexible wiring material 40 have the obtuse angles or the radiused form. Also, as in FIG. 8C, it is also acceptable that the form of the notch 40a is a two-level form. In this case too, in the vicinity of the innermost position of the notch 40a, the angled portions have the slight radiused form. A size of the notch 40a is appropriately determined in accordance with a size of the heat expansion difference and an extent of the external force exerted on the flexible wiring material 40.

Also, in FIG. 8B, the width (the Y direction) of the extended portion of the flexible wiring material 40, from the boundary of the bonding between the flexible wiring material 40 and the actuator 30, is less than the width of the flexible wiring material 40 bonded to the actuator 30 by a same amount from both width sides. Also, in the same way, when mounting onto the head holder 3 too, as it is smaller than the length of the slit 3c1, it is possible to avoid the effect due to the contact between the side edge of the flexible wiring material 40 and the longitudinal direction end of the slit 3c1, as described heretofore.

With the notches 40a, although it is preferable to provide notches 40a of an identical form in opposing positions at both ends of the flexible wiring material 40 in the width direction (the y direction), this is not limiting. As in FIG. 8C, it is acceptable that a notch 40b is provided in the side edge of one side of the flexible wiring material 40, in the vicinity of the border position, while on the side edge of the other side, the portion extended from the vicinity of the border position is smaller than the width of the bonded flexible wiring material 40.

In this way, by correcting in advance the heat expansion of the flexible wiring material 40 caused by a thermocompression for bonding the flexible wiring material 40 and the actuator 30, also, by correcting in advance the position displacement of the lands 60 caused by the heat expansion and setting the positions of the lands 60, and also, by providing simple notches 40a in both side ends of the border position C—C in which occurs the heat expansion difference in the flexible wiring material 40 between the portion superimposed on the actuator 30 and the extended portion, as well as being possible to prevent the distortion of the flexible wiring material 40 and increase the reliability of the connection, it is also possible to reduce the effect of the external force exerted on the flexible wiring material 40.

Figure 9:
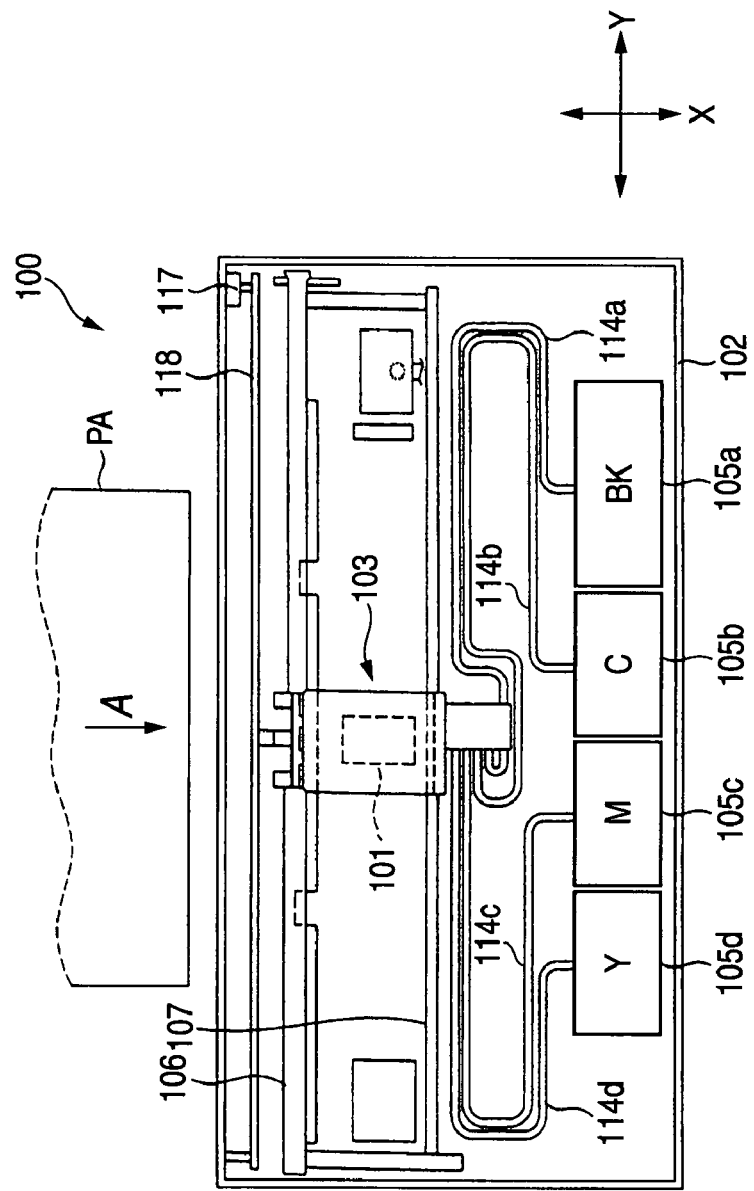
FIG. 9 is a plan view off an ink jet recording apparatus to which an ink jet head of another aspect of the invention is applied.

FIG. 9 shows an ink jet printer 100 applying an ink jet head 101 of the invention. The ink jet printer 100 of this aspect can be applied not only as, for example, an independent printer, but also as a multi-function device (MFD) equipped with a copying function, a scanning function, a facsimile function and the like. The ink jet printer 100 is configured in such a way that, being furnished inside a main body frame 102, the ink jet head 101 which ejects ink onto and records on paper PA, which is a recording medium, is mounted on a carriage 103, and runs in a main scanning direction (a Y direction).

The carriage 103, being slidably mounted on a rear guide shaft 106 and a front guide shaft 107 provided in parallel in the main scanning direction (the Y direction) inside the main body frame 102, is configured in such a way as to reciprocate in the main scanning direction (the Y direction) by means of a carriage drive motor 117 disposed in a right rear of the main body frame 102, and an endless timing belt 118. The paper PA is conveyed (in an arrow A direction in FIG. 9) horizontally on a bottom surface of the ink jet head 101, in a sub-scanning direction (an X direction) perpendicular to the main scanning direction (the Y direction), by a not-shown heretofore known paper conveying mechanism. The ink is ejected downward from nozzles 104 (refer to FIG. 13) of the ink jet head 101, which moves in the main scanning direction (the Y direction), onto the paper PA, and the recording is carried out.

Figure 10:
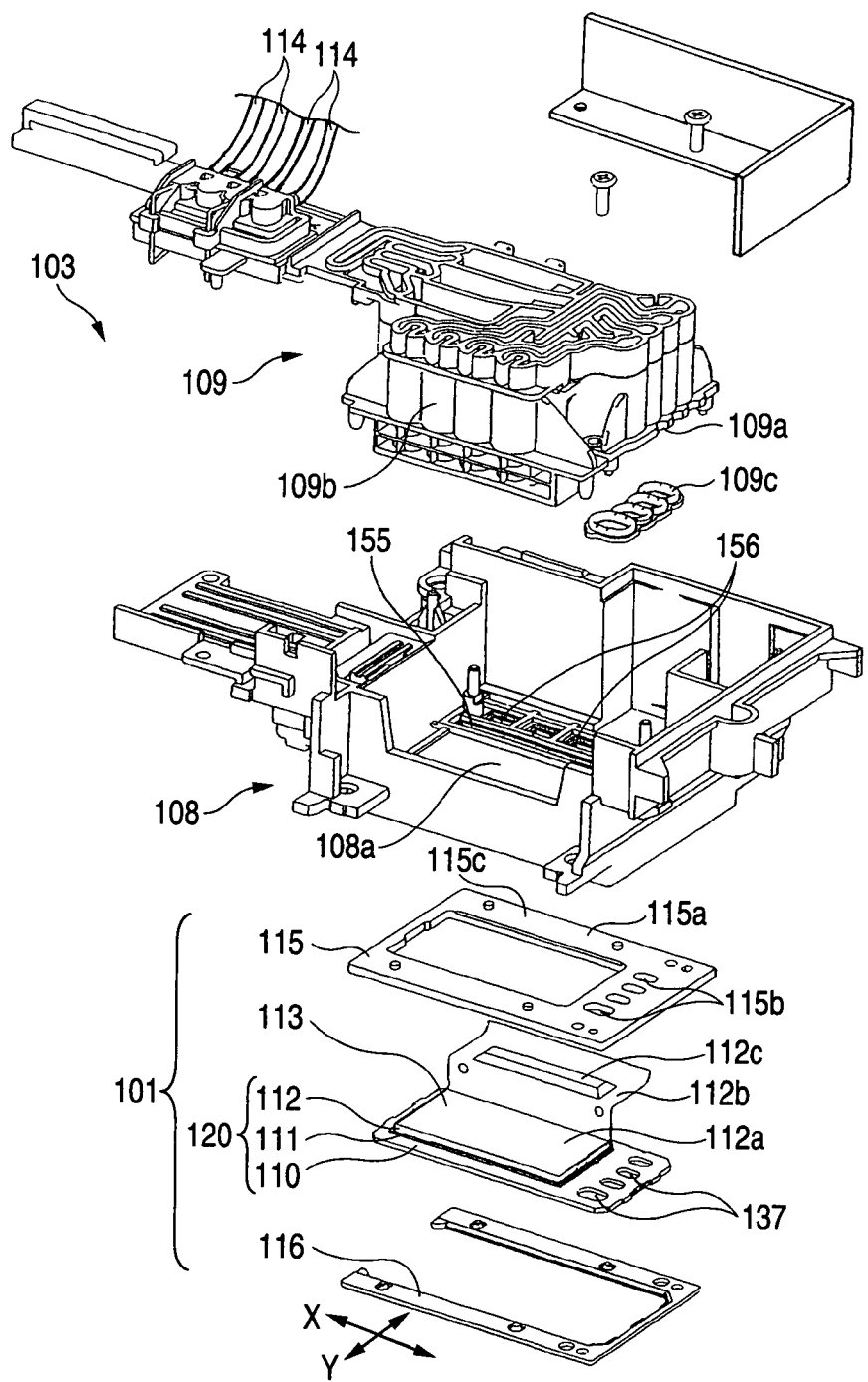
FIG. 10 is an exploded perspective view of a carriage.

An approximately box-shaped head holder 108 being furnished in the carriage 103, as shown in FIG. 10, a damper device 109, which stocks ink supplied to a carriage side, via ink supply tubes 114 (114a to 114d), from ink supply sources (ink tanks) 105a to 105d resting inside the main body frame 102, is attached to a top surface of a bottom plate 108a thereof. In the aspect, four colors of the ink (black, yellow, magenta and cyan) are provided. An inside of the damper device 109 being segregated into a plurality of ink chambers, the ink is stored by color in the ink chambers. Exhaust valve unit 109b, for removing air bubbles accumulating in the ink inside the ink chambers, is also provided in the damper device 109.

An aperture (not shown) being formed penetrating the bottom plate 108a of the head holder 108, ink outlets 109a of the dumper device 109 and ink intakes 137 of the ink jet head 101 are connected on an interior side of the aperture via connection holes 115b of a reinforcement frame 115, to be described hereafter, and elastic seal members 109c, and the ink is independently supplied by color from the dumper device 109 to the ink jet head 101. In the description, a nozzle orifice surface side of the ink jet head 101 is referred to as a front surface or a bottom surface, and an opposite side as a rear surface or a top surface.

Figure 11:
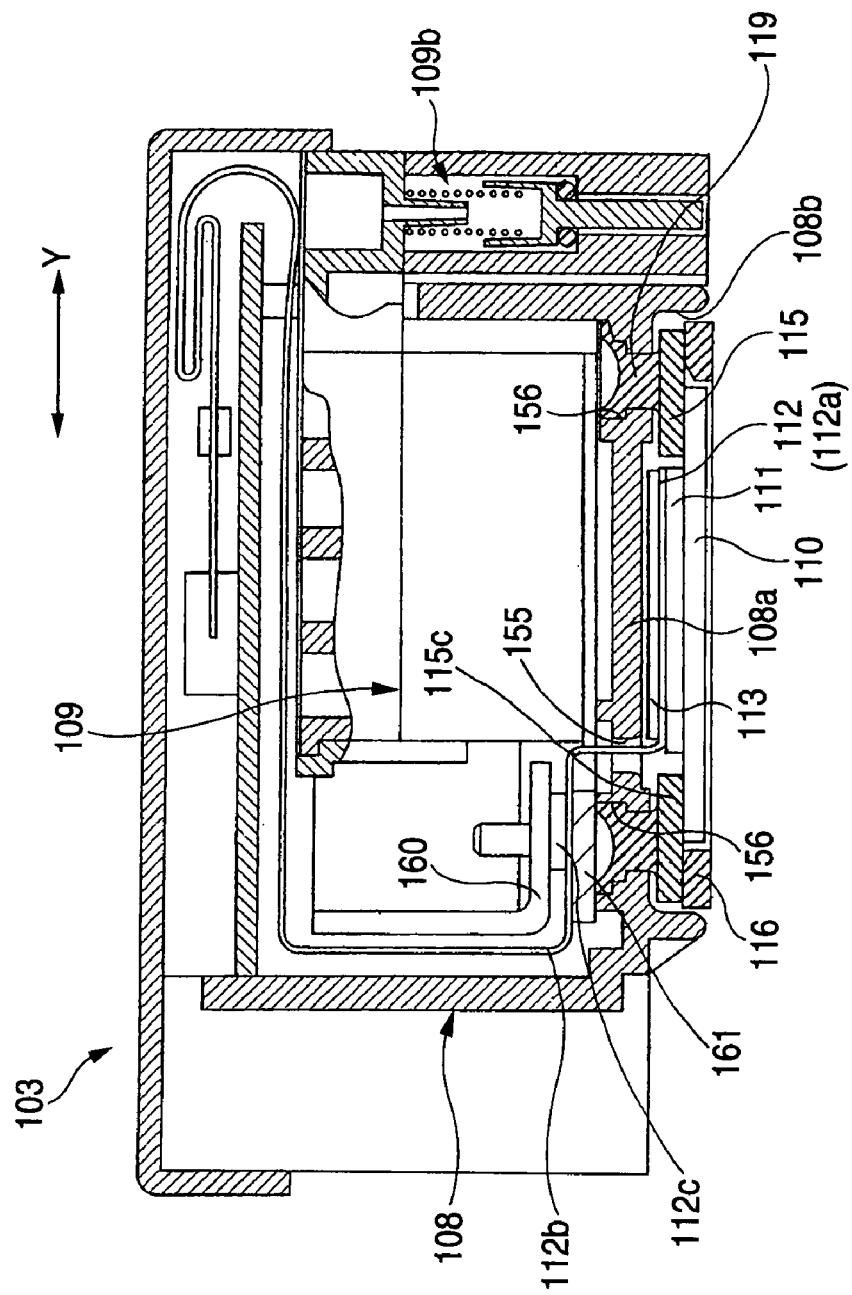
FIG. 11 is a sectional view of the carriage taken in a Y direction.

As shown in FIG. 11, the ink jet head 101, having an approximately flat overall shape, is housed, with a surface onto which the nozzles 104 open exposed facing downward, in a recessed portion 108b formed opening downward in a bottom surface of the head holder 108, and is affixed with an adhesive 119, maintaining a prescribed interval, so as to be approximately parallel to the bottom plate 108a which forms a ceiling surface of the concave portion 108b.

As shown in FIG. 10 and FIG. 11, a slit 155, which allows an insertion of a flexible portion 112b of a flexible flat cable 112, to be described hereafter, and a through hole 156 for pouring the adhesive 119 for affixing the ink jet head 101 to a bottom surface of the bottom plate 8a, are opened in the bottom plate 108a of the head holder 108.

The ink jet head 101 includes a head unit 120 configured in such a way that a cavity unit (corresponding to a cavity portion in the claims) 110, which opens a plurality of the nozzles 104 onto an exterior and has ink channels in an interior, a piezoelectric actuator 111, which applies a pressure to the ink inside the cavity unit 110 selectively ejecting it from the plurality of nozzles 104, and the flexible flat cable 112, which transmits a drive signal to the piezoelectric actuator 111, are disposed stacked together, and includes a rigid plate 113 and the reinforcement frame 115 on a rear surface of the head unit 120, and a front frame 116 on a front surface.

The cavity unit 110 and the piezoelectric actuator 111 both having an approximately rectangular flat shape in a plan view, long in the X direction, an external shape in a plan view of the cavity unit 110 being formed slightly larger than an external shape of the piezoelectric actuator 111, the piezoelectric actuator 111 is positioned in an approximate center of a rear surface of the cavity unit 110, and the ink intake 137 which supplies the ink to the plurality of nozzles 104 is formed opening onto the rear surface of the cavity unit 110.

Figure 15:
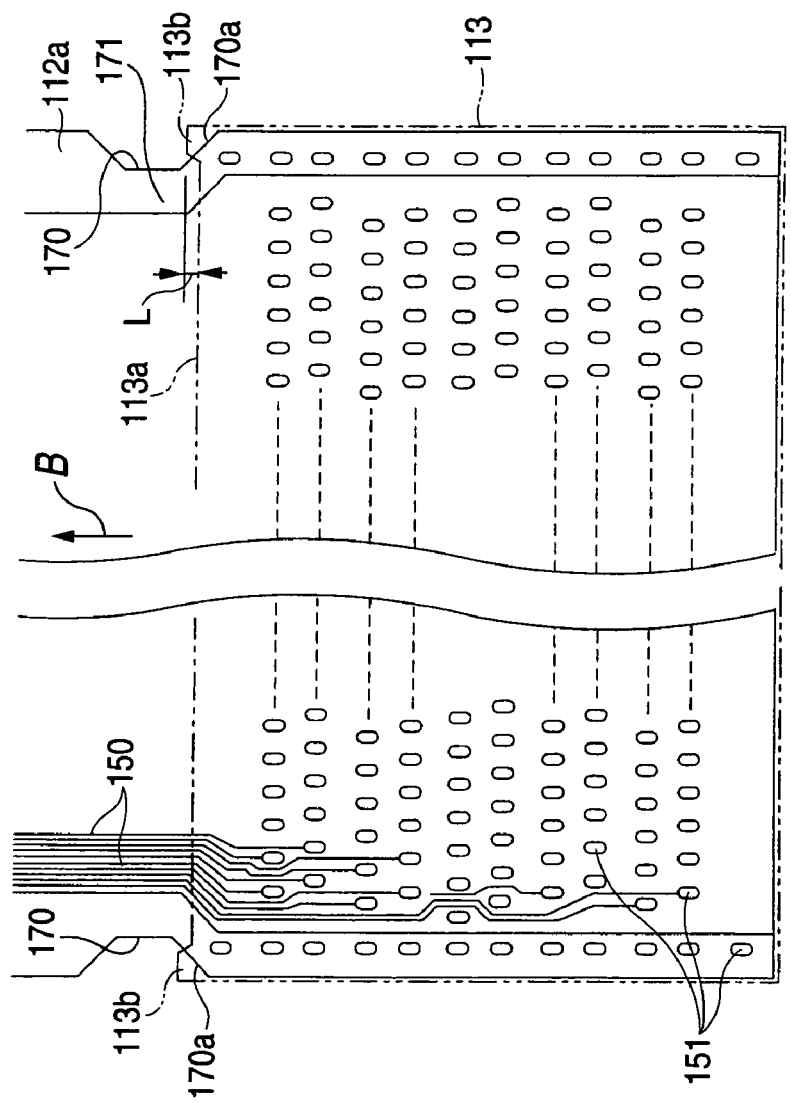
FIG. 15 is a bottom view showing a positional relationship between a flexible flat cable and a rigid plate.

The flexible flat cable 112 being of a structure in which a plurality of leads 150 are sandwiched between a flat base film and cover film made of a flat insulating material (polyimide or the like), forming an overall strip shape, a plurality of terminal electrodes 151 are provided by exposing ends of the leads 150 from a surface of the base film in a portion of a longitudinal direction thereof (refer to FIG. 15). In FIG. 15, only a portion of the leads 150 are shown. The terminal electrodes 151 are formed in as pattern corresponding to external electrodes 143 (refer to FIGS. 12 and 13) formed in a rear surface (a surface of a side opposite to the cavity unit 110) of the piezoelectric actuator 111.

One end of a longitudinal direction of the flexible flat cable 112 being superimposed on the rear surface of the piezoelectric actuator 111, the terminal electrodes 151 of the flexible flat cable 112 and the external electrodes 143 of the piezoelectric actuator 111 are welded together via bumps, configuring a flat portion 112a of the flexible flat cable 112. A region of the flexible flat cable 112 contiguous with a Y direction side end of the flat portion 112a configuring a flexible portion 112b which can bend freely, the flexible portion 112b is extended, curving and upright, on a rear surface side of the head holder 108 (refer to FIG. 11).

A COF (chip oh flexible flat cable), on which a chip-shaped integrated circuit is mounted, being applied as a drive circuit 112c part way in a longitudinal direction of the flexible portion 112b in the flexible flat cable 112, as shown in FIG. 11, in a condition in which the flexible portion 112b is inserted through the slit 155 of the head holder 108 and led into an interior (a top surface side of the bottom plate 108a) of the head holder 108, the drive circuit 112c is configured in such a way as to be gripped between a heat sink 160 and an elastic member 161 in a portion near one side plate of the head holder 108. By the above, a heat generated by the drive circuit 112c is radiated by the heat sink 160.

Figure 12:
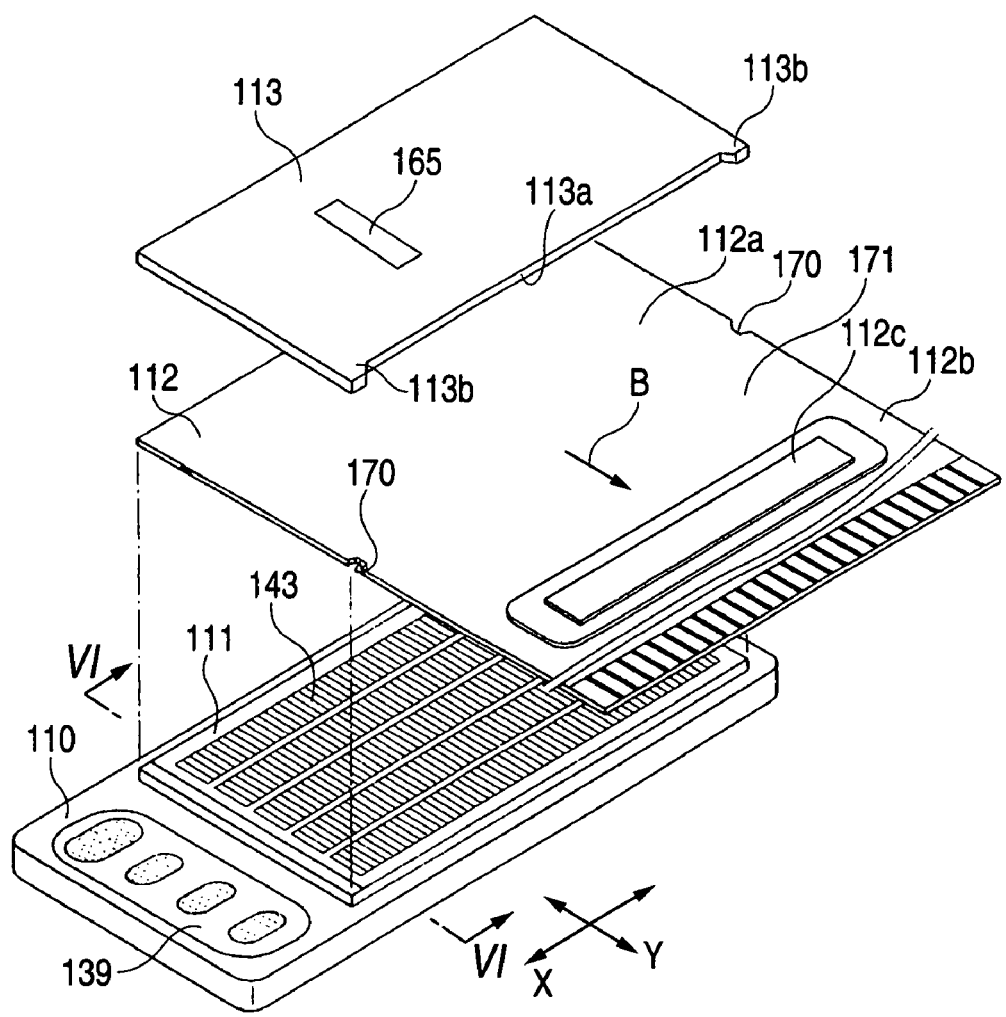
FIG. 12 is a partial exploded perspective view of a head unit and a heat sink.

In the flexible portion 112b of the flexible flat cable 112, as shown in FIGS. 12 and 15, removed portions 170 are formed by removing both side edges parallel to an extended direction B in such a way that a width dimension in a direction perpendicular to the extended direction B is narrower than the flat portion 112a. The removed portions 170 being formed by cutting away the side edges of the flexible portion 112b in such a way as to open toward an exterior and, by means of the removed portions 170, a waist being formed in a base end side of the flat portion 112a, the waist is taken as a narrow portion 171. Of two side edges and a bottom edge configuring each removed portion 170, it is preferable that at least a side edge 170a near the flat portion 112a (refer to FIG. 15) slants, in order to widen the opening of the removed portion 170 facing the exterior, as a result of which, the narrow portion 171 can be caused to curve (narrow) gently from the flat portion 112a.

Although, in the aspect, the removed portion 170 is formed in a cut away shape, it is also acceptable to provide a removed portion in a whole of each side edge, making a whole of the flexible portion 112b narrow.

The rigid plate 113, being positioned in a position on the rear surface of the flexible flat cable 112 corresponding to the piezoelectric actuator 111, is a flat plate material of a rectangular shape in a plan view having a size which covers approximately a whole surface of the piezoelectric actuator 111 and the flat portion 112a of the flexible flat cable 112. The rigid plate 113 being made of a material which has a greater rigidity than the flexible flat cable 112, and a heat conductance superior to that of the piezoelectric actuator 111 and the flexible flat cable 112, for example, aluminum, copper, stainless steel and the like are applicable. The rigid plate 113 not only has an advantage of increasing a rigidity of a whole of the head unit 120 but, by being attached firmly to the piezoelectric actuator 111 via the flexible flat cable 112, even in the event that heat is generated locally in the piezoelectric actuator 111, achieves an advantage of uniformizing a temperature distribution of a whole of the piezoelectric actuator 11, and of radiating heat.

As shown in FIGS. 12 and 15, a notch 113a of a width approximately corresponding to the narrow portion 171 of the flexible portion 112b is provided in an end edge, of end edges of the rigid plate 113, positioned on the extended side of the flexible portion 112b of the flexible flat portion 112, cut away toward a side opposite to the extended direction B, while two protrusions 113b protruding toward the removed portions 170 of the flexible portion 112b are provided on both ends (both ends sandwiching the notch 113a) of the notch 113a in a direction perpendicular to the extended direction B. The protrusions 113b are formed in such a way that at least tips thereof overlap the removed portions 170 in an up-down position in a stacking direction. In detail, the side edge 170a of the removed portions 170 and the protrusions 113b intersect in a plan view. Also, a depth dimension (cut away amount) L of the notch 113a, shown in FIG. 15, is set comparatively shallow in order to definitely cover all bonded places of the external electrodes 143 of the piezoelectric actuator 111 and the terminal electrodes 151 of the flexible flat cable 112 with a portion of the rigid plate 113 excepting the notch 113a.

The rigid plate 113 being formed by a press processing of a metal plate material, a surface processing or a printing is carried out on one of a front or back surface thereof as identification information 165, for identifying the front and back surfaces. A plating, a coating, a gloss finishing or the like can be applied as the surface processing, while a stamp, a mark with a pen or an engraving can be applied as the printing. Herein, information on a manufacturing lot is printed with a stamp as the identification information 165 on a surface which is to be a burr surface of the rigid plate 113, that is, a surface opposite to a surface making contact with the flexible flat cable 112. By the above, it is possible to carry out both the identification of the front and back surfaces and an ascertainment of the manufacturing lot information by checking the identification information 165.

The reinforcement frame 115, being a member for reinforcing the cavity unit 110, is made of a material (for example, a metal plate of stainless used steel or the like) of a rigidity superior to that of the cavity unit 110, its perimeter is rectangular and, being a flat plate material formed slightly larger than the cavity unit 110 in a plan view, is formed in a frame shape having a through opening slightly larger than a plan view shape of the piezoelectric actuator 111. The reinforcement frame 115, by being positioned along a rear surface of the cavity unit 110 in such a way as to surround the piezoelectric actuator 111, prevents a deformation or distortion of the cavity unit 110 with its thin, flat shape, and a gap is formed between an interior surface (an inner perimeter surface) of a frame portion of the reinforcement frame 115 and an exterior surface (an outer perimeter surface) of the piezoelectric actuator 111. The reinforcement frame 115 is also formed by a press processing of a metal plate material.

A thickness dimension of the reinforcement frame 115 is set so that, when the reinforcement frame 115 is positioned on the rear surface of the cavity unit 110, the reinforcement frame 115 protrudes higher than the piezoelectric actuator 111 positioned on the rear surface of the same cavity unit 110.

The frame portion 115a of the reinforcement frame 115 forms an enlarged rectangular frame shape in the X direction in a plan view, and four of the heretofore mentioned connection holes 115b are juxtaposed in a region toward one short end parallel to the Y direction, penetrating a front and back surface thereof. Also, the flexible portion 112b of the flexible flat cable 112 is extended over one long side parallel to the X direction, of the frame portion 115a of the reinforcement frame 115. This long side is taken as a first side portion 115c.

The front frame 116, being a flat plate material with a a squared U-shape in a plan view, is disposed in such a way as to surround the cavity unit 110 on a front surface side of the head unit 120, and is affixed to a front surface of the reinforcement frame 115 (refer to FIGS. 10 and 11). By means of the front fame 116, a level difference between a nozzle surface of the cavity unit 110 and a perimeter of the head holder 108 is eliminated, preventing a catching when cleaning the nozzle surface with a brushing member or the like.

Next, a description will be given of a configuration of the cavity unit 110 in the aspect.

Figure 13:
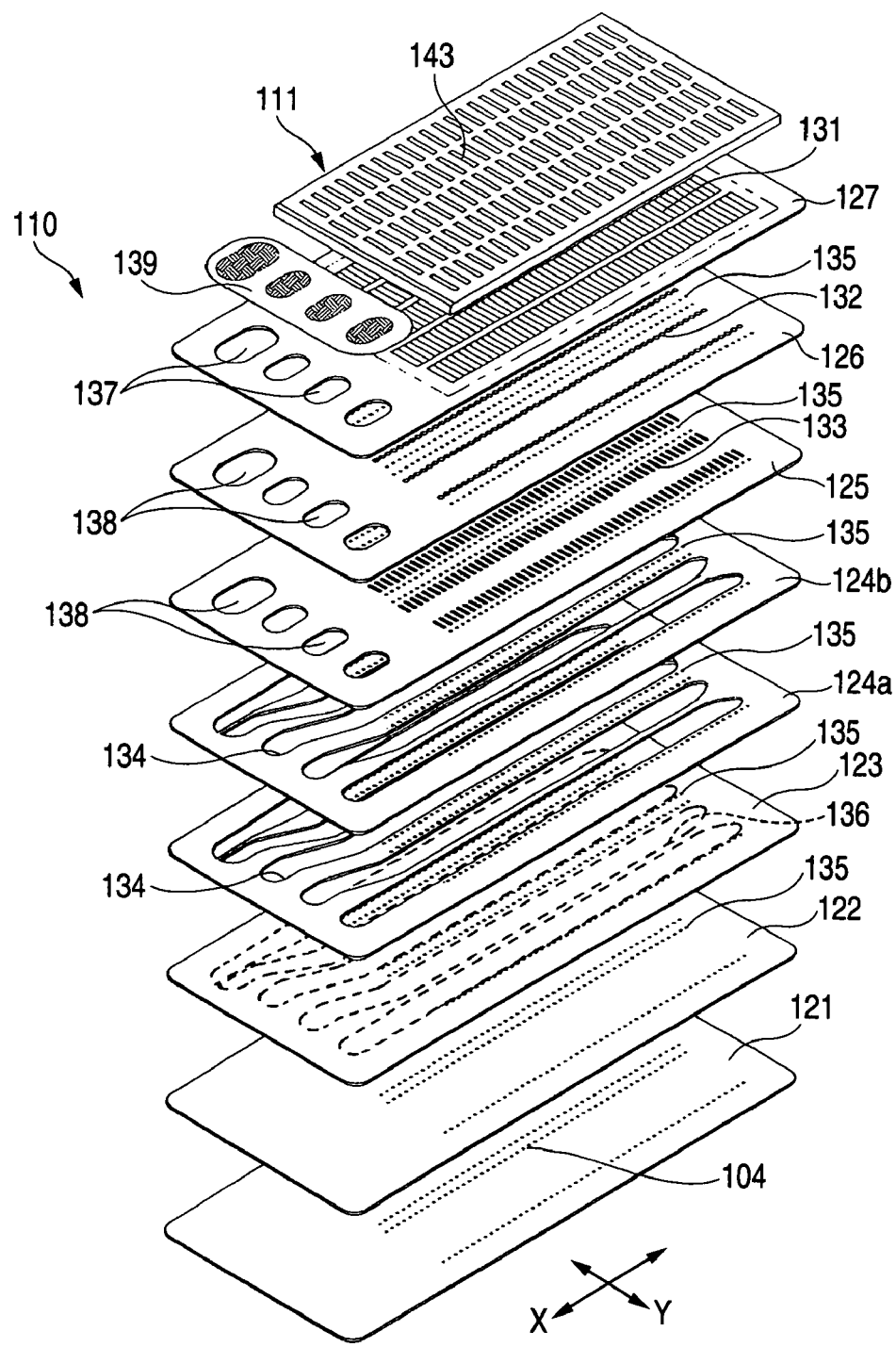
FIG. 13 is an exploded perspective view of a cavity unit.

The cavity unit 110, as shown in FIGS. 13, 14A and 14B is configured of a total of eight thin, flat plates, a nozzle plate 121, a spacer plate 122, a damper plate 123, two manifold plates 124a and 124b, a supply plate 125, a base plate 126 and a cavity plate 127, bonded stacked together via an adhesive in such a way that each flat plate surface is opposed.

In the aspect, each plate 121 to 127 having a thickness in the order of 40 to 150 µm, the nozzle plate 121 is made of a synthetic resin such as polyimide, while the other plates 122 to 127 are made of a 42% nickel alloy steel sheet. The nozzles 104 of a microscopic diameter (around 20 µm) for ejecting the ink being bored in a large number of places at microscopic intervals in the nozzle plate 121, the nozzles 104 are disposed in an array formation extending in the X direction, with five arrays being provided.

The nozzles 104 are each connected to the pressure chambers 131 in the cavity plate 131 via through channels 135 bored in the spacer plate 122, the damper plate 123, the two manifold plates 124a and 124b, the supply plate 125 and the base plate 126 (refer to FIGS. 14A and 14B).

A plurality of the pressure chambers 131 are arranged in five arrays in the cavity plate 127, corresponding to the arrangement of the nozzles 104. Each pressure chamber 131, as shown in FIG. 13, is formed penetrating a plate thickness of the cavity plate 127 in such a way as to be of an elongated shape in a plan view, with a longitudinal direction thereof following the Y direction. One end of a longitudinal direction of each pressure chamber 131 communicates with common ink chambers 134 via communication holes 132 bored in the base plate 126 and connection channels 133 formed in the supply plate 125. The heretofore described through channels 135 are connected to the other end of the longitudinal direction of each pressure chamber 131.

Five grooves long (in orders to be the common ink chambers 134) in the X direction being formed penetrating a plate thickness in the two manifold plates 124a and 124b, by stacking the two manifold plates 124a and 124b, and by covering a top surface thereof with the supply plate 125, and covering a bottom surface with the damper plate 123, a total of five common ink chambers (manifold chambers) 134 are formed.

Damper chambers 136, coinciding in position and shape with the common ink chambers 134, and isolated from the common ink chambers 134, are concavely formed in a bottom surface side of the damper plate 123 neighboring a bottom surface of the manifold plate 124a. As a thin plate-shaped ceiling portion of an upper portion of each damper chamber 136 vibrates freely due to an elastic deformation, the damper plate 123 absorbs and reduces a pressure fluctuation transmitted from then pressure chamber 131 to the common ink chamber 134, suppressing a crosstalk which the pressure fluctuation transmits to another pressure chamber 131.

Also, four of the heretofore mentioned ink intakes 137 being bored toward one side parallel to the Y direction of the cavity plate 127, four connection holes 138 are bored in each of the base plate 126 and the supply plate 125, aligned in an up-down position with each ink intake 137. A filter body 139, for removing a foreign body in the ink, is affixed as one via an adhesive or the like to the four ink intakes 137.

In the aspect, black ink flows divergently from one ink intake 137, on a left side in FIG. 13, into two common ink chambers 134 and 134, also on the left side, and nozzle arrays ejecting the black ink are set in two arrays. This is taking into account a fact that a usage frequency of the black ink is high in comparison with other color inks, and each of the other inks, cyan, yellow and magenta, is supplied independently to the other three ink intakes 137.

In this way, in the cavity unit 110, the ink flows from the ink intakes 137 by way of the connection holes 138 into the common ink chambers 134, and an ink channel is formed reaching the pressure chambers 131 by way of the connection channels 133 and the communication holes 132, and furthermore, reaching the nozzles 104 by way of the through channels 135.

The piezoelectric actuator 111, being of a flat shape having a size which covers all of the pressure chambers 131, includes a plurality of ceramic layers 111a stacked in a direction perpendicular to a flat direction, and electrodes 141 and 142 sandwiched between the ceramic layers 111a. At least one of the electrodes 141 and 142, being disposed corresponding to each pressure chamber 131, can displace a portion of the ceramic layer corresponding to the pressure chamber 131, and add an ejection pressure to the ink inside the pressure chamber 131, by selectively applying a voltage between the electrodes. The electrodes corresponding to the pressure chambers 131, and a plurality of the external electrodes 143 connected via an electrical through hole penetrating the ceramic layers in a stacking direction, are disposed in a flat surface formation on a top surface of a topmost ceramic layer. Also, the external electrodes 143 are individually connected electrically to the terminal electrodes 151 formed on the flexible flat cable 112.

Next, a description will be given of a method of assembling the ink jet head 101 with the heretofore described configuration in the head holder 108.

First, the cavity unit 110 and the piezoelectric actuator 111 are stacked, then, the external electrodes 143 of the piezoelectric actuator 111 and the terminal electrodes 151 of the flexible flat cable 112 are electrically connected. In the electrical connection, bumps are formed in advance on one of either the external electrodes 143 or the terminal electrodes 151, the external electrodes 143 and the terminal electrodes 151 are aligned, and a bonding is carried out by pressing and fusing. Then, by means of the bonding, an end of the flexible flat cable 112 becomes the flat portion 112a superimposed on the piezoelectric actuator 111.

Next, the rigid plate 113 is affixed, with an adhesive such as an adhesive tape, in such a way as to cover a rear surface of the flat portion 112a of the flexible flat cable 112 but, at this time, the narrow portion 171 of the flexible portion 112b is positioned in the notch 113a of the rigid plate 113, and the tips of the protrusions 113b of the rigid plate 113 are positioned in such a way as to be superimposed over the removed portions 170 of the flexible portion 112b.

Next, the reinforcement frame 115 is affixed with an adhesive to the rear surface of the cavity unit 110 in such a way as to surround the piezoelectric actuator 111, at which time, the flexible portion 112b of the flexible flat cable 112 is lifted up so as to pass through a rear surface side of the first side portion 115c of the reinforcement frame 115.

Next, the flexible portion 112b of the flexible flat cable 112 is inserted through the slit 155 bored in the bottom plate 108a of the head holder 108, and a rear surface of the reinforcement frame 115 is positioned in such a way as to leave a gap with the bottom surface of the bottom plate 108a of the head holder 108, and become parallel thereto. Then, the adhesive 119 is poured from the through hole 156 of the bottom plate 108a, and the ink jet head 1 is affixed to the head holder 108. Next, the front frame 116 is affixed with the adhesive to a front surface of the reinforcement frame 115 in such a way as to surround the nozzle, surface of the ink jet head 101.

In the assembly process described heretofore, at a time of affixing the reinforcement frame 115 to the rear surface of the cavity unit 110, and at a time of affixing the ink jet head 1 to the head holder 108, when lifting up the flexible portion 112b of the flexible flat cable 112, or when conveying the ink jet head in another manufacturing process, as the flexible flat cable is shaken around, a force is exerted such as to separate the bond of the flat portion 112a and the piezoelectric actuator 111 from the extended side of the flexible portion 112b.

The flat portion 112a of the flexible flat cable 112 being covered with the rigid plate 113, which has a higher rigidity than the flexible flat cable 112, as the flat portion 112a is held along the rear surface of the piezoelectric actuator 111 by the rigidity of the rigid plate 113, compared with a case in which the rigid plate 113 is not provided, an advantage is achieved of reducing the separation of the flat portion 112a.

In addition, when lifting up the flexible flat cable 112, the flexible flat cable 112 bends with the narrow portion 171 positioned in the notch 113a of the rigid plate 113 as a base. That is, of the end edges of the flat portion 112a positioned in the extended direction B of the flexible portion 112b, although the force such as to separate the flat portion 112a is exerted in a position, corresponding to a width of the notch 113a, as positions corresponding to external sides of the width of the notch 113a being held down by the protrusions 113b of the rigid plate 113, making it difficult for the force such as to separate the flat portion 112a to be exerted directly, the advantage of preventing the separation of the flat portion 112a is further increased.

Also, as shown in FIG. 16A, as the flexible portion 112b, stands up with the narrow portion 171 positioned in the notch 113a of the rigid plate 113 as a base, compared with a case shown in FIG. 16B in which the notch 113a is not provided, a gap between it and an internal perimeter surface of the reinforcement frame 115 is widened by an amount of the depth dimension (the cut away amount) L of the notch 113a, enabling it to bend gently. This also achieves the advantage of preventing the separation of the flat portion 112a.

Next, a description will be given of a processed shape of the rigid plate 113 and the reinforcement frame 115 and an attachment thereof. The rigid plate 113 and the reinforcement frame 115 are both formed by a press processing of a metal plate material, as a result of which, a burr caused by the press processing occurs in them. In order to remove the burr, adding a burr removal process (such as a barreling process or a surface pressing process) can also be considered but, as a manufacturing cost rises in the event that the burr removing process is carried out to remove all the burr, there is a need to reduce the burr removal process as far as possible, and also to eliminate an adverse effect of the burr.

Consequently, with regard to the rigid plate 113, as shown in FIG. 16A, by disposing a burr surface 181 on which burr 180 occurs on a side opposite to the side making contact with the flexible flat cable 112, it is possible to eliminate a likelihood of the burr of the rigid plate 113 making contact with the flexible flat cable 112, and causing a disconnection or the like.

Also, with regard to the reinforcement frame 115, the burr surface 181 on which the burr 180 occurs is disposed on a side opposite to a side making contact with the cavity unit 110, and the burr removal process is carried out by the surface pressing only on an internal edge of the first side portion 115c of the reinforcement frame 115. By the above, even in the event that the flexible portion 112b of the flexible flat cable 112 makes contact with the first side portion 115c, it is possible to eliminate a likelihood of a scratching by the burr. Also, by limiting the burr removal process to an absolute minimum number of places, it is possible to prevent the rise in the manufacturing cost.

Also, as a surface of the side of the reinforcement frame 115 making contact with the cavity unit 110 is a sagging surface which is on a side opposite to the burr surface 181, it being easy to firmly affix adhesion surfaces of the reinforcement frame 115 and the cavity unit 110, it is possible to prevent an occurrence of a defect such as an imperfect adhesion, an ink leak or the cross talk due to a separation of the adhesion surfaces caused by the burr.

Although, in the aspect, the piezoelectric actuator has been used as the actuator, regarding another drive method, such as one which causes the ink to be ejected by displacing an oscillator by means of static electricity, as long as it is of an aspect in which the flexible flat cable is positioned on one surface of the actuator, the invention can be applied.

What is claimed is:

1. An ink jet head comprising:
   an actuator including a plurality of terminals arranged in arrays on a surface of the actuator, for applying pressure corresponding to a plurality of energy generators for ejecting ink;
   a wiring material coupled with a base made of a flexible resin film on which a plurality of lands are arranged in arrays corresponding to the plurality of terminals, the wiring material of which one end is superimposed on the surface of the actuator, and which extended to a direction parallel to the surface of the actuator as an extended portion; and
   a drive circuit for driving the actuator;
   wherein the terminals and the lands are bonded by thermocompression;
   wherein the wiring material includes a small width portion, of which a width in a direction perpendicular to an extended direction of the wiring material is smaller than that of the one end superimposed on the actuator, arranged on the extended portion;
   wherein the drive circuit is mounted on the extended portion;
   wherein wiring patterns are formed on the wiring material, for connecting the drive circuit and the plurality of lands;
   wherein the small width portion is a notch formed in a vicinity of the one end superimposed on the actuator;
   wherein the notch is provided in each end in the width direction of the wiring material; and
   wherein the notch is provided between portions of the wiring material which have widths larger than the width of the small width portion in the direction perpendicular to the extended direction of the wiring material.

2. The ink jet head according to claim 1;
   wherein an arrangement direction of the plurality of lands is set with an expansion accompanying the thermocompression of the base corrected.

3. The ink jet head according to claim 1;
   the plurality of terminals are disposed in a plurality of arrays;
   the plurality of lands are disposed in a plurality of arrays corresponding to the plurality of terminals;
   a wiring connected to each land is wired passing through a space between the lands; and
   the notch is arranged in a position in which the plurality of wiring patterns converge, outside the land intervals in the direction in which the wiring material is extended.

4. The ink jet head according to claim 1; wherein the notch has a form in which vicinities of innermost positions in the width direction of the wiring material are linked by a radius or an obtuse angle in a plan view.

5. The ink jet head according to claim 1;
   wherein a width of the extended portion is smaller than that of the one end.

6. The ink jet head according to claim 1;
   wherein the wiring patterns include electric loads which are formed on each end in the width direction of the wiring material.

7. The ink jet head according to claim 6;
   wherein the plurality of terminals arranged on the surface of the actuator includes common terminals and discrete terminals;
   wherein the common terminals are arranged on each end of the actuator;
   wherein the discrete terminals are arranged between the ends of the actuator provided with the common terminals; and
   wherein the electric loads are connected to the common terminals.

8. A head unit comprising:
   an ink jet head including: an actuator including a plurality of terminals arranged in arrays on a surface of the actuator, for applying pressure corresponding to a plurality of energy generators for ejecting ink; a wiring material coupled with a base made of a flexible resin film on which a plurality of lands are arranged in arrays corresponding to the plurality of terminals, the wiring material of which one end is superimposed on the surface of the actuator, and which extended to a direction parallel to the surface of the actuator as an extended portion; and a drive circuit for driving the actuator; and
   a box-shaped head holder including: a bottom wall; and a slit;
   wherein the terminals and the lands are bonded by thermocompression;
   wherein the wiring material includes a small width portion, of which a width in a direction perpendicular to an extended direction of the wiring material is smaller than that of the one end superimposed on the actuator, arranged on the extended portion;
   wherein the drive circuit is mounted on the extended portion;
   wherein wiring patterns are formed on the wiring material, for connecting the drive circuit and the plurality of lands;
   wherein the ink jet head is installed under the bottom wall of the box-shaped head holder;
   wherein the wiring material is passed through the slit opened in the bottom wall;
   wherein the small width portion is a notch formed in a vicinity of the one end superimposed on the actuator;
   wherein the notch is provided in each end in the width direction of the wiring material; and
   wherein the notch is provided between portions of the wiring material which have widths larger than the width of the small width portion in the direction perpendicular to the extended direction of the wiring material.

9. The head unit according to claim 8;
   wherein the small width position is arranged corresponding to the slit.

10. The ink jet head according to claim 8;
wherein the wiring patterns include electric loads which are formed on each end in the width direction of the wiring material.

11. The ink jet head according to claim 10;
wherein the plurality of terminals arranged on the surface of the actuator includes common terminals and discrete terminals;
wherein the common terminals are arranged on each end of the actuator;
wherein the discrete terminals are arranged between the ends of the actuator provided with the common terminals; and
wherein the electric loads are connected to the common terminals.

12. An ink jet head comprising:
a cavity portion which opens a plurality of nozzles onto an exterior and has an ink channel in an interior;
an actuator which selectively applies an ejection pressure to ink inside the cavity portion;
a flexible flat cable which transmits a drive signal being bonded to the actuator;
wherein the actuator includes a plurality of electrodes arranged in a flat formation corresponding to the plurality of nozzles;
wherein the flexible flat cable includes a flat portion superimposed on the plurality of electrodes of the actuator and electrically bonded, and a flexible portion extended from one end of the flat portion;
wherein the flexible portion includes removed portions removing both side edges parallel to an extended direction of the flexible portion;
wherein the removed portions are formed in such a way that a width dimension of a direction perpendicular to the extended direction is smaller than that of the flat portion;
wherein a rigid plate is affixed to a rear surface of a side opposite to a side on which the flexible flat material is bonded to the plurality of electrodes, and covers an approximate whole surface of the flat portion;
wherein a rigidity of the rigid plate is higher than that of the flexible flat cable;
wherein an end edge of the rigid plate, which is the extended side of the flexible portion, is cut into a side opposite to the extended direction of the flexible portion as a notch;
wherein a width of the notch is approximately equivalent to that of a narrow portion of the flexible portion; and
wherein the rigid plate includes two protrusions protruding toward the removed portions of the flexile portion, in both ends of a direction perpendicular to the extended direction of the flexible portion.

13. The ink jet head according to claim 12;
wherein the rigid plate includes a heat conductance superior to that of the actuator, and the rigid plate contacts with the actuator via the flexible flat cable.

14. The ink jet head according to claim 12, further comprising:
a reinforcement frame for reinforcing the cavity portion;
wherein the actuator is arranged on one surface of the cavity portion;
wherein the reinforcement frame is fixed to the one surface, in such a way as to surround the actuator, maintaining a gap between an internal surface of a frame portion thereof and an external surface of the actuator;
wherein the reinforcement frame protrudes higher than the actuator from the one surface of the cavity portion; and
wherein the flexible portion of the flexible flat cable is extended from the flat portion arranged inward from an inner perimeter of the frame portion of the reinforcement frame, in such a way as to stand up on a rear surface side of the reinforcement frame.

15. The ink jet head according to claim 14;
wherein the cavity portion includes an ink intake on a surface to which the reinforcement frame is fixed;
wherein the reinforcement frame is superimposed on the ink intake and includes a connection hole which leads the ink from an ink supply source to the ink intake;
wherein the reinforcement frame is formed in the frame shape by a press processing of a metal plate material;
wherein a burr surface of the reinforcement frame on which a burr caused by the press processing is disposed on a side opposite to a side which contacts with the cavity portion; and
wherein the burr is removed from at least an interior edge arranged on a side on which the flexible portion of the flexible flat cable is extended.

16. The ink jet head according to claim 12;
wherein the rigid plate is formed by a press processing of a metal plate material; and
wherein a burr surface of the rigid plate on which a burr caused by the press processing is disposed on a side opposite to a side which contacts with the flexible flat material.

17. The ink jet head according to claim 16;
wherein the burr surface includes a sign that is formed by a surface processing or a printing.

* * * * *